(12) United States Patent
Watanabe et al.

(10) Patent No.: US 7,545,160 B2
(45) Date of Patent: Jun. 9, 2009

(54) PROBE CHIP AND PROBE CARD

(75) Inventors: Tsuyoshi Watanabe, Saitama (JP);
Takehisa Takoshima, Kawaguchi (JP)

(73) Assignee: Enplas Corporation, Saitama (JP)

( * ) Notice: Subject to any disclaimer, the term of this patent is extended or adjusted under 35 U.S.C. 154(b) by 217 days.

(21) Appl. No.: 11/607,844

(22) Filed: Dec. 4, 2006

(65) Prior Publication Data
US 2007/0126442 A1 Jun. 7, 2007

(30) Foreign Application Priority Data
Dec. 6, 2005 (JP) .............................. 2005-352770
Nov. 30, 2006 (JP) .............................. 2006-324212

(51) Int. Cl.
*G01R 31/02* (2006.01)
(52) U.S. Cl. ..................................... 324/762
(58) Field of Classification Search ........................ None
See application file for complete search history.

(56) References Cited

U.S. PATENT DOCUMENTS

| | | | | |
|---|---|---|---|---|
| 6,333,497 B2* | 12/2001 | Shimada et al. | .......... | 250/201.3 |
| 6,809,539 B2* | 10/2004 | Wada et al. | .................. | 324/762 |
| 6,852,968 B1* | 2/2005 | Ouchi et al. | ................. | 250/234 |
| 6,906,543 B2* | 6/2005 | Lou et al. | .................... | 324/754 |
| 6,974,712 B2* | 12/2005 | Ouchi et al. | .................. | 438/29 |
| 7,061,262 B2* | 6/2006 | Mai | ........................... | 324/758 |
| 2002/0008530 A1* | 1/2002 | Kim et al. | .................... | 324/754 |
| 2004/0154165 A1* | 8/2004 | Takoshima et al. | ............ | 29/846 |
| 2006/0033521 A1* | 2/2006 | Mai | ........................... | 324/762 |
| 2008/0191726 A1* | 8/2008 | Ku et al. | ..................... | 324/762 |

FOREIGN PATENT DOCUMENTS

| | | |
|---|---|---|
| JP | 8-64646 | 3/1996 |
| JP | 8-313557 | 11/1996 |

* cited by examiner

*Primary Examiner*—Jermele M Hollington
(74) *Attorney, Agent, or Firm*—Staas & Halsey LLP

(57) ABSTRACT

The present invention provides a probe chip and a probe card in which when troubles such as breakage etc. occur in a probe of a contact portion of a probe card, the contact portion can be easily replaced with another one. In the probe card having a guide frame, a probe chip and a fixing jig, a second arm portion of a cantilever of the probe chip is abutted on a conductive path of a fixing jig such that the probe chip is held or pressed down and fixed to the guide frame with the second arm portion being elastically deformed.

20 Claims, 22 Drawing Sheets

PROBE CHIP AND PROBE CARD

BACKGROUND OF THE INVENTION

1. Field of the Invention

The present invention relates to a probe chip and a probe card which are used in an electrical test of LSI. The probe chip and the probe card are placed between LSI under test (DUT; Device under Test) which is formed on a semiconductor wafer and a tester for LSI (LSI tester), to supply DUT with power for driving a circuit, ground which acts as a standard of voltage and signals to test the circuit and to convey responding signals in response to the test signals from DUT to the LSI tester. More specifically, the present invention relates to a new probe chip which is easily replaceable with another one and is a type of narrow pitch, and relates to a new probe card using the new probe chip.

2. Description of the Prior Art

An average conventional probe card is disclosed in the Japanese Patent Publication No. HEI8-64646 A (Prior Art 1). That is, in the conventional probe card in the prior art reference, probe pins made of metal such as tungsten are fixed to a pedestal (fixing ring) made of ceramic etc. in a predetermined pitch. One end of the pin is a free end (this free end contacts to a pad on the DUT) and the other end is soldered to a metal wiring on a circuit board.

The probe card is mounted on a prober to test the DUT formed on a semiconductor wafer. The free end of the probe pin is contacted to a predetermined pad on the DUT by a driving mechanism of the prober. When the free end of the probe pin contacts with the pad of the DUT, power for driving the circuit, ground which acts as a standard of voltage and signals to test the circuit are supplied from the LSI tester to the DUT and a responding signal in response to the test signals are conveyed from the DUT to the LSI tester.

In general, a plurality of DUTs are formed on a wafer so that the above-mentioned operation should be repeated in order to test all DUTs on the wafer. Therefore, it is necessary for the probe pin to make repeated contact with the pads on the DUT. Due to the repeated contact, the probe pin tends to be deformed, contaminated or broken at its front edge due to the difference in height of the pads, the existence of foreign material on the pads etc. In addition, the probe pin is also worn by the repeated contact with the metal pads because the probe pin is also made of metal.

If the front edge of the probe pin is deformed or contaminated, a contact resistance between the probe pin and the pad increases, being unable to carry out accurate testing so that it is necessary to repair or replace the damaged probe pin with a new one. Further, an arrangement of the pad on the DUT is different from one kind to another. Therefore, the arrangement of the probe pin on the probe card should be changed based on the kind of the DUT. Accordingly, the probe card should be replaced with another one when another kind of DUT is tested.

Furthermore, the Japanese Patent Publication No. HEI08-313557A (Prior Art 2) discloses art to solve the problem in the Prior Art 1. The patent discloses a probe block in which a crank shaped probe pin is fixed on a base. One end of the crank-shaped probe pin is elastically contacted to an output terminal of TAB (Tape Automated Bonding). And a probe block is detachably attached to the base of the prober. Accordingly, at the time of replacement of a probe pin with another one, repairing of a probe pin, or changing of the arrangement of probe pin at the time of using another type of DUT can be done by replacing the probe block with another one.

However in the conventional probe card, the probe pin is fixed to the pedestal and the probe pin is fixed to the circuit board by way of soldering. Therefore, the whole set of probe card should be removed from the prober in case where the probe pin is repaired or replaced. In addition, fixing of the probe pin on the pedestal, soldering of the probe pin on the circuit board and adjusting the height of the front edge of the probe pin are all carried out manually, so that the cost of the probe card increases with the increase in the number of the probe pin. Furthermore, long time is required for repairing and replacement of the probe card, resulting in deterioration in the efficiency of the LSI testing. As mentioned above, the probe pin is made from metal needle so that a certain thickness is required. In other words, if the thickness of the probe pin is under the certain level, a desired weight can not be applied on the free end when the free end is contacted to the pad, being unable to lower the contact resistance. Accordingly, narrow-pitch narrower than a certain level can not be attained as long as metal needles are used as the probe pins.

In the Prior Art 2, a probe block is disclosed. And repairing and replacement of the probe pin and changing of the probe-pin arrangement can be carried out, but the pedestal on which the crank-shaped probe pin is fixed should be made of insulating material such as ceramic etc. In addition, a surface on which the crank-shaped probe pin is fixed should be formed to have an inclined surface. Generally it is difficult to get a desired shape with high accuracy when ceramic material is used. Even if this is possible, long time is still required for the processing. Producing a narrow-pitch type is also difficult as long as the crank-shaped probe pin is made of metal as explained above.

SUMMARY OF THE INVENTION

Accordingly, it is an object of the present invention to provide a new probe chip with narrow pitch, which can be easily replaceable with another one, and to provide a probe card using the same probe chip.

In order to attain such objects, the present invention is characterized in that a probe chip comprises:

a pedestal;

an insulating layer on the pedestal; and a plurality of cantilever made of silicon, the cantilever being disposed on the insulating layer and having a first and a second arm portion extending substantially horizontally from the pedestal in opposite direction to each other, wherein a metal wiring layer extending from the first to the second arm portion is formed on each surface of the cantilever, and a conductive projection is electrically connected to the metal wiring layer in the vicinity of an end portion of the first arm portion.

Another aspect of the present invention is characterized in that another insulating layer is formed on the surface of the cantilever, and the metal wiring layer extending from the first to the second arm portion is formed on the another insulating layer of each cantilever.

Still another aspect of the probe chip of the present invention is characterized in that another conductive projection is provided to be electrically connected to the metal wiring layer of the second arm portion.

Yet another aspect of the probe chip of the present invention is characterized in that another conductive projection is provided to be electrically connected to the metal wiring layer of the second arm portion.

Another aspect of the present invention is characterized in that a probe card comprises:
  a probe chip comprising:
    a pedestal;
    an insulating layer on the pedestal; and
    a plurality of cantilever made of silicon, the cantilever being disposed on the insulating layer and having a first and a second arm portion extending substantially horizontally from the pedestal in an opposite direction to each other, wherein a metal wiring layer which extends from the first to the second arm portion is formed on each surface of the cantilever, and a conductive projection is electrically connected to the metal wiring layer in the vicinity of an end portion of the first arm portion;
  a guide frame;
  a wiring board; and
  a fixing jig, wherein the probe chip can be detachably attached to the guide frame using the fixing jig, the fixing jig having a conductive path for electrically connecting the second arm portion of the cantilever of the probe chip to the wiring board can be detachably attached to the guide frame, the second arm portion of the cantilever of the probe chip is elastically bent toward the guide frame using the fixing jig such that the second arm portion of the cantilever is electrically connected to an end portion of the conductive path of the fixing jig using the repulsive force of the cantilever and that an upper surface of the fixing jig is disposed at a place lower than the conductive projection of the first arm portion of the cantilever.

Another aspect of the present invention is characterized in that another insulating layer is formed on the surface of the cantilever, and the metal wiring layer extending from the first to the second arm portion is formed on the insulating layer of each cantilever.

Another aspect of the present invention is characterized in that another conductive projection is provided to be electrically connected to the metal wiring layer of the second arm portion of the probe chip.

Another aspect of the present invention is characterized in that another conductive projection is provided to be electrically connected to the metal wiring layer of the second arm portion.

Another aspect of the present invention is characterized in that the cantilever made of silicon on the insulating layer which is formed on the pedestal is made of a high-resistance silicon.

Another aspect of the present invention is characterized in that the conductive projection is a metal post formed by plating, a metal bump or a projection formed by ultra-fine particle jet printing.

Another aspect of the present invention is characterized in that the metal wiring layer on the cantilever made of silicon and the conductive projection are covered by a plating layer.

Another aspect of the present invention is characterized in that the pedestal is made of silicon.

Another aspect of the present invention is characterized in that the conductive projection is formed to have a mushroom shape.

Another aspect of the present invention is characterized in that the cantilever made of silicon on the insulating layer on the pedestal is made of a high-resistance silicon.

Another aspect of the present invention is characterized in that the conductive projection is a metal post formed by plating, a metal bump or a projection formed by ultra-fine particle jet printing.

Another aspect of the present invention is characterized in that the metal wiring layer and the conductive projection on the cantilever made of silicon are covered by a plating layer.

Another aspect of the present invention is characterized in that the pedestal is made of silicon.

Another aspect of the present invention is characterized in that the conductive projection is formed to have a mushroom shape.

Another aspect of the present invention is characterized in that a probe card comprises:
  a probe chip;
  a guide frame;
  a wiring board; and
  a fixing jig, wherein the probe chip can be detachably attached to the guide frame using the fixing jig, the fixing jig has a conductive path electrically connecting the second arm portion of the cantilever of the probe chip and the circuit board, and the second arm portion of the cantilever of the probe chip is elastically bent toward the guide frame using the fixing jig such that the second arm portion of the cantilever is electrically connected to an end portion of the conductive path of the fixing jig using the repulsive force of the cantilever, a plurality of cantilevers are arranged in parallel on both right and left sides, the second arm portions of the cantilevers on both right and left sides are arranged close and opposed to each other, with a predetermined distance, and the first arm portions are arranged away from each other in opposite directions, and the fixing jig is designed to be inserted between the second arm portions of the cantilever on the right and left sides.

Another aspect of the present invention is characterized in that the fixing jig has a plain plate, and on both plain surfaces, an electric path is formed so that the electric paths on both plain surfaces of the plain plate are electrically connected to the second arm portions of the cantilevers on the right and left sides, while, a pair of right and left contact pins are formed to be projected from the circuit board so that the fixing jig is inserted between the pair of contact pins so as to establish an electrical connection with the electrical path on both plain surfaces of the plain plate.

According to the present invention, by using the probe chip which comprises:
  a pedestal;
  an insulating layer on the pedestal; and
  a plurality of cantilever made of silicon, the cantilever being disposed on the insulating layer and having a first and a second arm portion extending substantially horizontally from the pedestal in an opposite direction to each other, a metal wiring layer which extends from the first to the second arm portion being formed on each surface of the cantilever, and a conductive projection being electrically connected to the metal wiring layer in the vicinity of an end portion of the first arm portion, a contact function of the probe pin to the DUT (in the probe chip, this function is realized by the cantilever made of silicon) can be realized, and a connecting function to a PCB can be separated from the contact function. Accordingly, in case where the probe pin (cantilever) is broken or stained, the probe chip can be replaced with another one by only removing the probe chip from the probe card. Because the probe pin (cantilever) made of silicon has excellent mechanical properties and can be processed with high accuracy using semiconductor fine-processing technology, a small size probe pin that could not be realized so far can now be realized and even a narrow pitching can also be realized.

According to another aspect of the present invention, in a probe chip which comprises:
    a pedestal;
    an insulating layer on the pedestal; and
    a plurality of cantilever made of silicon, the cantilever being placed on the insulating layer and having a first and a second arm portion extending substantially horizontally from the pedestal in opposite direction to each other, a metal wiring layer which extends from the first to the second arm portion being formed on each surface of the cantilever, and a conductive projection being electrically connected to the metal wiring layer in the vicinity of an end portion of the first arm portion, another insulating layer is formed under the metal wiring layer so that electrical insulating property between each cantilever made of silicon can be improved. Therefore, both leakage current between each cantilever and crosstalk of high frequency signals can be reduced.

According to still another aspect of the present invention, in a probe chip which comprises:
    a pedestal;
    an insulating layer on the pedestal; and
    a plurality of cantilever made of silicon, the cantilever being placed on the insulating layer and having a first and a second arm portion extending substantially horizontally from the pedestal in an opposite direction to each other, a metal wiring layer which extends from the first to the second arm portion being formed on each surface of the cantilever, and a conductive projection being electrically connected to the metal wiring layer in the vicinity of an end portion of the first arm portion, a conductive projection is provided in the vicinity of the front edge of the second arm portion of the cantilever, so that a probe chip which has more reliable electrical contact with the fixing jig can be realized.

According to yet another aspect of the present invention, in a probe chip which comprises:
    a pedestal;
    an insulating layer on the pedestal; and
    a plurality of cantilever made of silicon, the cantilever being placed on the insulating layer and having a first and a second arm portion extending substantially horizontally from the pedestal in an opposite direction to each other, a metal wiring layer which extends from the first to the second arm portion being formed on each surface of the cantilever, and a conductive projection being electrically connected to the metal wiring layer in the vicinity of an end portion of the first arm portion, a conductive projection is provided at the second arm portion of the cantilever made of silicon, so that a probe chip which has more reliable electrical contact with the fixing jig can be realized. In addition, an insulating layer is provided under the metal wiring layer, so that a probe chip that has an improved electrical insulating property between silicon cantilevers can be realized.

According to another aspect of the present invention, in a probe card which comprises:
    a probe chip comprising:
        a pedestal;
        an insulating layer on the pedestal; and
        a plurality of cantilever made of silicon, the cantilever being disposed on the insulating layer and having a first and a second arm portion extending substantially horizontally from the pedestal in an opposite direction to each other, a metal wiring layer which extends from the first to the second arm portion being formed on each surface of the cantilever, and a conductive projection being electrically connected to the metal wiring layer in the vicinity of an end portion of the first arm portion;
    a guide frame;
    a wiring board; and
    a fixing jig, the probe chip being able to be detachably attached to the guide frame using the fixing jig, the fixing jig having a conductive path for electrically connecting the second arm portion of the cantilever of the probe chip to the wiring board being able to be detachably attached to the guide frame, the second arm portion of the cantilever of the probe chip being elastically bent toward the guide frame using the fixing jig such that the second arm portion of the cantilever is electrically connected to an end portion of the conductive path of the fixing jig using the repulsive force of the cantilever, and an upper surface of the fixing jig being disposed at a place lower than the conductive projection of the first arm portion of the cantilever, in case where probe pin is being broken or stained, the probe pin can be replaced with another one by only replacing the probe chip, thus being able to improve efficiency of LSI testing.

Further, the upper surface of the fixing jig is disposed at a place lower than the conductive projection of the first arm portion of the cantilever so that when an electrical continuity test is conducted by contacting the conductive projection with a LSI, the test can be carried out smoothly. When an object to be tested is not a single LSI but an element in which silicon chip is not yet cut off from a wafer silicon, there is no fear that a peripheral portion of the wafer abuts on an upper surface of the fixing jig so that an inspection can be carried out in good condition.

According to another aspect of the present invention, by using a probe card which comprises:
    a probe chip comprising:
        a pedestal;
        an insulating layer on the pedestal; and
        a plurality of cantilever made of silicon, the cantilever being disposed on the insulating layer and having a first and a second arm portion extending substantially horizontally from the pedestal in an opposite direction to each other, a metal wiring layer which extends from the first to the second arm portion being formed on each surface of the cantilever, and a conductive projection being electrically connected to the metal wiring layer in the vicinity of an end portion of the first arm portion;
    a guide frame;
    a wiring board; and
    a fixing jig, the probe chip being able to be detachably attached to the guide frame using the fixing jig, the fixing jig having a conductive path for electrically connecting the second arm portion of the cantilever of the probe chip to the wiring board being able to be detachably attached to the guide frame, the second arm portion of the cantilever of the probe chip being elastically bent toward the guide frame using the fixing jig such that the second arm portion of the cantilever is electrically connected to an end portion of the conductive path of the fixing jig using the repulsive force of the cantilever, and an upper surface of the fixing jig being disposed at a place lower than the conductive projection of the first arm portion of the cantilever, in case where probe pin is being broken or stained, the probe pin can be replaced with another one by only replacing the probe chip, thus being able to improve efficiency of LSI testing.

According to another aspect of the present invention, by using a probe card which comprises:
a probe chip comprising:
a pedestal;
an insulating layer on the pedestal; and
a plurality of cantilever made of silicon, the cantilever being disposed on the insulating layer and having a first and a second arm portion extending substantially horizontally from the pedestal in an opposite direction to each other, a metal wiring layer which extends from the first to the second arm portion being formed on each surface of the cantilever, and a conductive projection being electrically connected to the metal wiring layer in the vicinity of an end portion of the first arm portion;
a guide frame;
a wiring board; and
a fixing jig, the probe chip being able to be detachably attached to the guide frame using the fixing jig, the fixing jig having a conductive path for electrically connecting the second arm portion of the cantilever of the probe chip to the wiring board being able to be detachably attached to the guide frame, the second arm portion of the cantilever of the probe chip being elastically bent toward the guide frame using the fixing jig such that the second arm portion of the cantilever is electrically connected to an end portion of the conductive path of the fixing jig using the repulsive force of the cantilever, and an upper surface of the fixing jig being disposed at a place lower than the conductive projection of the first arm portion of the cantilever, in case where probe pin is being broken or stained, the probe pin can be replaced with another one by only replacing the probe chip, thus being able to improve efficiency of LSI testing.

According to another aspect of the present invention, by using a probe card which comprises:
a probe chip comprising:
a pedestal;
an insulating layer on the pedestal; and
a plurality of cantilever made of silicon, the cantilever being disposed on the insulating layer and having a first and a second arm portion extending substantially horizontally from the pedestal in an opposite direction to each other, a metal wiring layer which extends from the first to the second arm portion being formed on each surface of the cantilever, and a conductive projection being electrically connected to the metal wiring layer in the vicinity of an end portion of the first arm portion;
a guide frame;
a wiring board; and
a fixing jig, the probe chip being able to be detachably attached to the guide frame using the fixing jig, the fixing jig having a conductive path for electrically connecting the second arm portion of the cantilever of the probe chip to the wiring board being able to be detachably attached to the guide frame, the second arm portion of the cantilever of the probe chip being elastically bent toward the guide frame using the fixing jig such that the second arm portion of the cantilever is electrically connected to an end portion of the conductive path of the fixing jig using the repulsive force of the cantilever, and an upper surface of the fixing jig being disposed at a place lower than the conductive projection of the first arm portion of the cantilever, in case where probe pin being broken or stained, the probe pin can be replaced with another one by only replacing the probe chip, thus being able to improve efficiency of LSI testing.

According to another aspect of the present invention, the cantilever made of silicon on the insulating layer which is formed on the pedestal is made of a high-resistance silicon. Therefore, leakage current between each cantilever made of silicon and crosstalk of high frequency signals can be reduced.

According to another aspect of the present invention, the conductive projection is a metal post formed by plating, a metal bump or a projection formed by ultra-fine particle jet printing. Therefore, contact resistance can be reduced.

According to another aspect of the present invention, an electric resistance of the metal wiring layer of the probe chip can be reduced, and a mechanical strength of the conductive projection can be improved by covering, at the same time the metal wiring layer on the cantilever made of silicon and the conductive projection with a plating layer.

According to another aspect of the present invention, the pedestal is made of silicon. Therefore, a semiconductor fine-processing technology can be used for processing the pedestal so that fitting structure, for example, which is used in detachably attaching the probe chip to the guide frame, can be formed with high accuracy.

According to another aspect of the present invention, the conductive projection is formed to have a mushroom shape. Therefore, a predetermined contact area can be secured at the time the conductive projection is pushed onto the pad, being able to stabilize the contact resistance between them.

According to another aspect of the present invention, the cantilever made of silicon on the insulating layer on the pedestal is made of a high-resistance silicon. Therefore, leakage current between each cantilever made of silicon and crosstalk of high frequency signals can be reduced.

According to another aspect of the present invention, electrical resistance of the metal wiring layer of the probe chip can be reduced and mechanical strength of the conductive projection can be improved by covering, at the same time, the metal wiring layer on the cantilever made of silicon and the conductive projection with a plating layer.

According to another aspect of the present invention, the pedestal is made of silicon. Therefore, semiconductor fine-processing technology can be used for processing the pedestal so that fitting structure, for example, which is used in detachably attaching the probe chip to the guide frame, can be formed with high accuracy.

According to another aspect of the present invention, the conductive projection is formed to have a mushroom shape. Therefore, a predetermined contact area can be secured at the time the conductive projection is pushed onto the pad, being able to stabilize the contact resistance between them.

According to another aspect of the present invention, the cantilever made of silicon on the insulating layer on the pedestal is made of a high-resistance silicon. Therefore, leakage current between each cantilever made of silicon and crosstalk of high frequency signals can be reduced.

According to another aspect of the present invention, the probe chip can be easily arranged and set up because the probe chip is held down by only inserting the fitting jig, and a plurality of adjacent LSIs can be closely arranged and a plurality of LSIs can be tested at the same time.

According to another aspect of the present invention, the fixing jig has a plain plate, and on both surfaces of the plain plate, an electric path is formed. Such fixing jig is only inserted in the vertical direction so that occupied space in

DETAILED DESCRIPTION

The nature and further characteristic features of the present invention will be made more clear from the following descriptions made with reference to the accompanying drawings.

FIRST EMBODIMENT

FIGS. 1 to 9 represent a first embodiment of the present invention.

Figure 1:
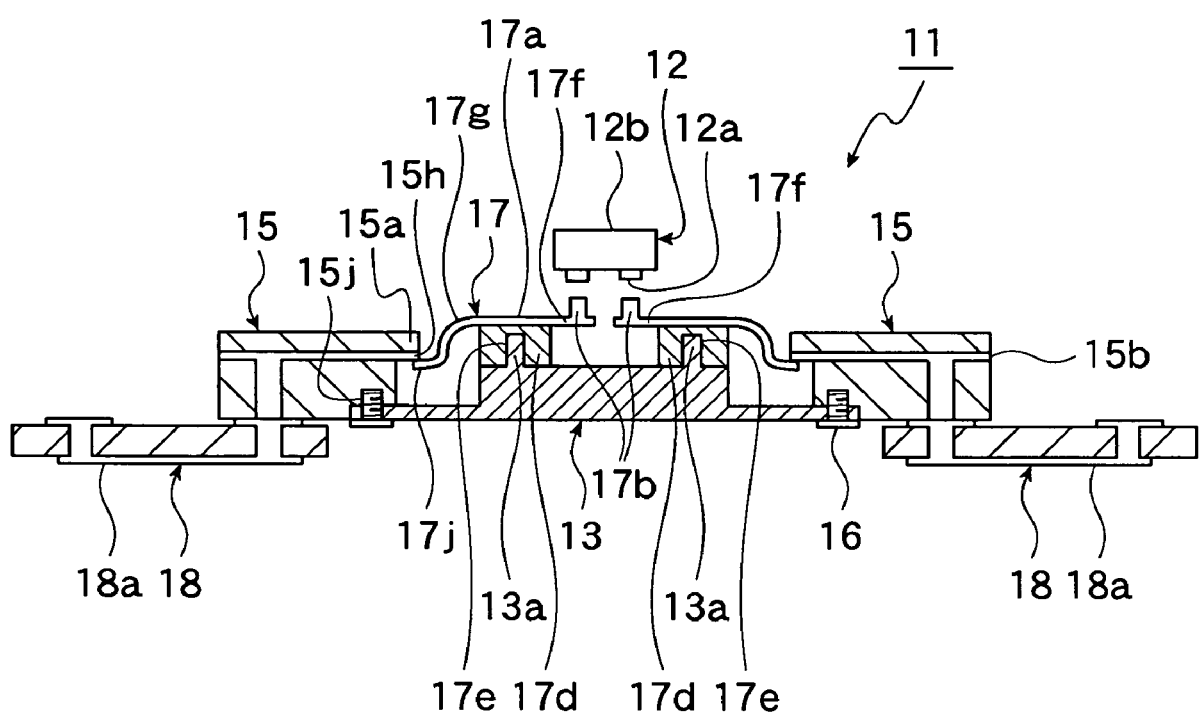
FIG. 1 is a sectional view of a probe card of a first embodiment of the present invention.
Figure 2:
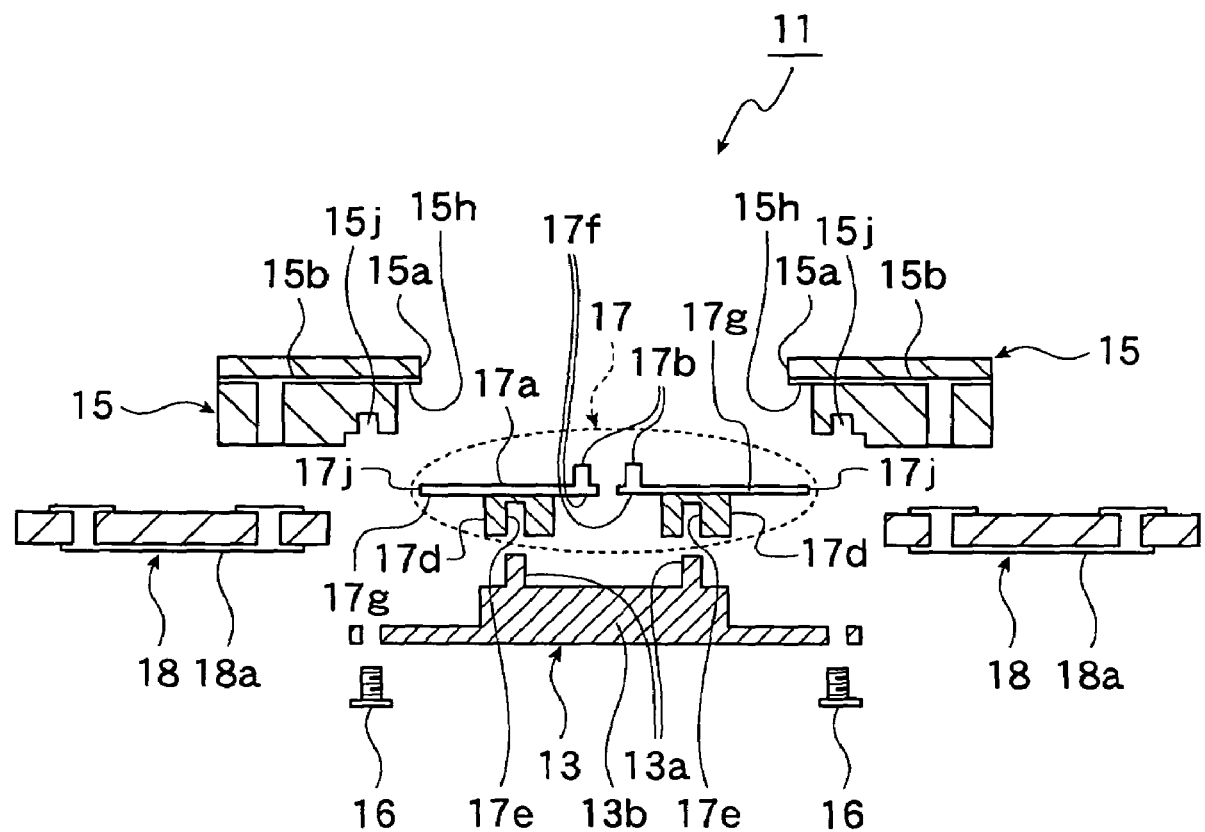
FIG. 2 is an exploded view of the probe card of the first embodiment.

FIG. 1 is a sectional view of a probe card of the first embodiment of the present invention and FIG. 2 is an exploded view showing a dismantled probe card. The probe card 11 is used for, for example, product inspection of an electrical continuity test of LSI 12 and provided with a guide frame 13, a probe chip 17 and a fixing jig 15.

As shown in FIG. 1, the LSI 12 has a plurality of terminals 12a on a bottom surface of, for example, a square-like package body 12b. The terminals are arranged along the two sides opposite to each other.

Figure 3:
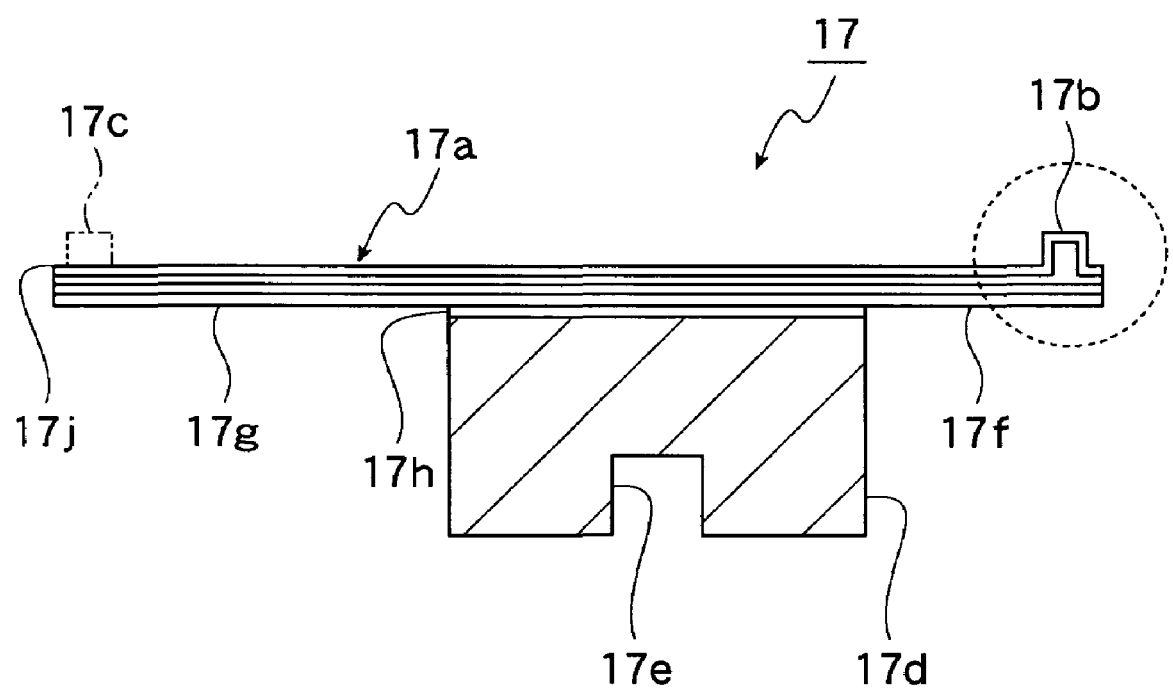
FIG. 3 is a sectional view of a probe chip in the probe card of the first embodiment.

As shown in FIG. 3, a probe chip 17 has a silicon pedestal 17d made of silicon, on an upper surface of which an insulating layer 17h made of silicon dioxide ($SiO_2$) is formed. Silicon cantilevers 17a made of silicon on the insulating layer 17h extend substantially horizontally from the pedestal 17d in opposite direction to each other. On an under-side of the pedestal 17d, there is an alignment hole 17e into which a standard projection 13a of the guide frame 13 is fitted and positioned.

Figure 5:
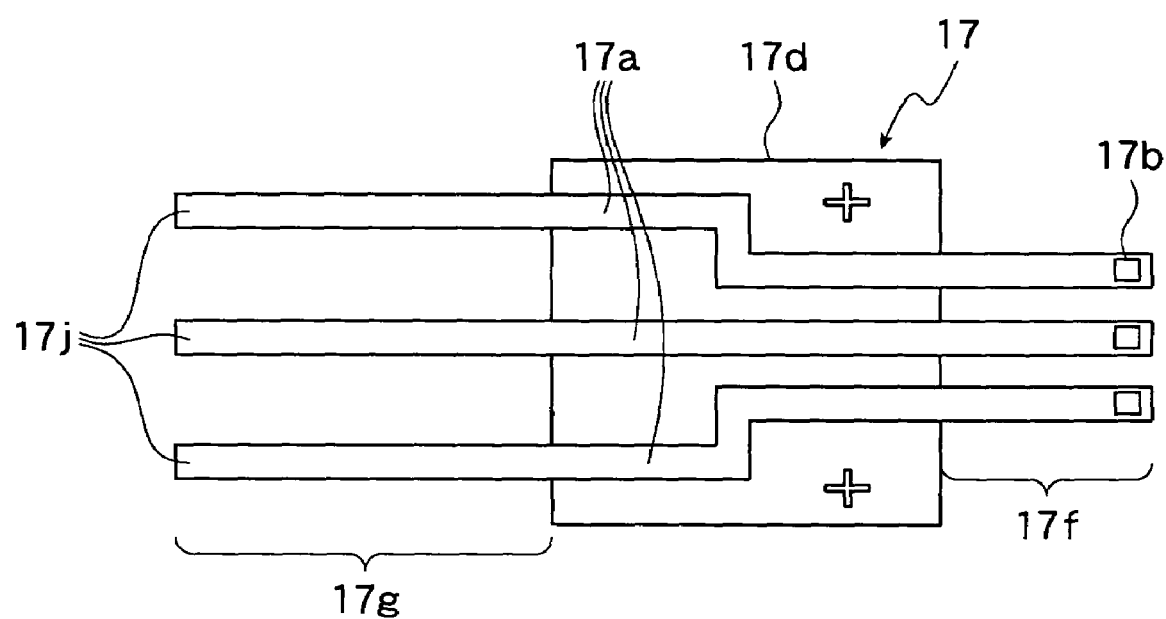
FIG. 5 is a plan view of the probe chip of the first embodiment.

As shown in FIG. 5, a plurality of cantilevers 17a are formed on the pedestal 17d. The number and pitch of the cantilever are determined in accordance with the number and pitch of the terminals of the LSI 12 to be tested. A first arm portion 17f and a second arm portion 17g extend from both sides of the pedestal 17d. The first arm portion 17f is designed to contact the terminal 12a of the LSI 12 to be tested. In order to achieve reliable contact with the terminal 12a, a conductive projection 17b is provided in the vicinity of the front end of the first arm portion. A plane type contact portion 17j is also provided in the vicinity of a front end of the second arm portion 17g in order to establish contact with a circuit portion 18a formed on a circuit board 18. A conductive projection 17c, like the conductive projection 17b, can further be provided at the contact portion 17j as shown by a two dot chain line in FIG. 3.

Figure 4:
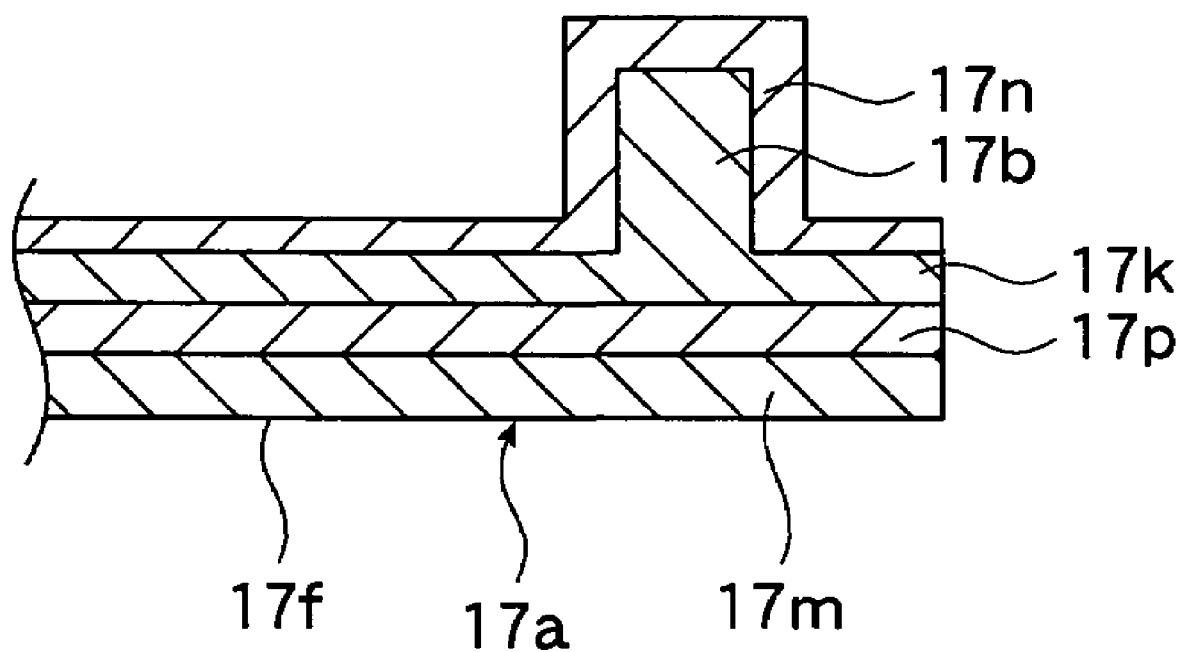
FIG. 4 is a sectional view of a front end portion of a cantilever of the first embodiment.

As shown in FIG. 4, the cantilever 17a has a silicon dioxide ($SiO_2$) insulating layer 17p on the silicon (Si) layer 17m. Further, a nickel (Ni) layer is placed via a chrome layer (not shown) on the silicon dioxide insulating layer. The nickel layer serves as a conductive metal layer 17k. At one end portion of the cantilever 17a, the conductive projection 17b made of nickel is further provided on the nickel layer (metal wiring layer 17k). Around the cantilever 17a, gold or gold-and-cobalt plating layer 17n is provided. This plated layer 17n has a function to lower the conductive resistance of the cantilever 17a and to reinforce the conductive projection 17b, which stands at an end portion thereof, preventing the conductive projection from falling down.

The distance between the adjacent cantilevers 17a and the width of the cantilever are changed on the pedestal 17d in accordance with the arrangement of the terminals of the LSI 12. The distance between the adjacent first arm portions 17f and their width of the cantilever 17a should be made narrow, while the distance between the adjacent second arm portions 17g and their width are made large in order to connect them to a circuit portion 18a of the circuit board 18 (see FIG. 5).

The guide frame 13 has a platform 13b projecting upward and having a prescribed area at a central portion of a plane plate. A standard projection 13a for positioning the probe chip 17 is provided on the platform 13b.

The fixing jig 15 is a frame-like jig for pressing and fixing the probe chip 17 to the guide frame 13 and has an opening portion at its central portion.

The fixing jig 15 has a conductive path 15b in its inside for electrically connecting the circuit portion 18a of the circuit board 18 and the cantilever 17a of the probe chip 17. On the contact side of the fixing jig 15, where the second arm portion 17g of the cantilever 17a is contacted to, a ledge portion 15a is projectedly provided. The end portion 15h of the conductive path 15b is extended along an under surface of the ledge portion 15a. A screw hole 15j into which a bolt 16 is screwed is formed as shown in FIGS. 1 and 2.

As shown in FIG. 2, the probe card 11 is assembled as follows. Firstly the probe chip 17 is positioned on the guide frame 13 such that the standard projection portion 13a is inserted into the alignment hole 17e of the pedestal 17d. Then the fixing jig 15 is fixed to the guide frame 13 by positioning the fixing jig 15 face to face with the probe chip 17 in the opening portion and inserting the bolt 16 through the guide frame 13 into the screw hole 15j and screwing up the bolt. At this time, the second arm portion 17g of the cantilever 17a of the probe chip 17 abuts on the end portion 15h of the conductive path 15b of the fixing jig 15. And the probe chip 17 is held down and fixed by the fixing jig 15 with the second arm portion 17g being elastically bent by the ledge portion 15a.

In case where there is no ledge portion 15a, the second arm portion 17g of the cantilever 17a of the probe chip 17 can be elastically bent and held down by the end portion 15h of the protruded conductive path 15b.

The above operation leads to the following condition that the conductive projection 17b formed at the first arm portion 17f of the cantilever 17a of the probe chip 17 is projected higher than the upper surface of the fixing jig 15. Therefore no problem arises when LSI 12 is contacted with the conductive projection 17b at the time of carrying out the conductive testing.

In case where the test object is not a single LSI 12 but is a component in which a silicon chip is not yet cut out from a silicon wafer, conductive testing can be smoothly carried out without having the upper surface of the fixing jig 15 abut on the peripheral portion of the wafer.

Figure 6:
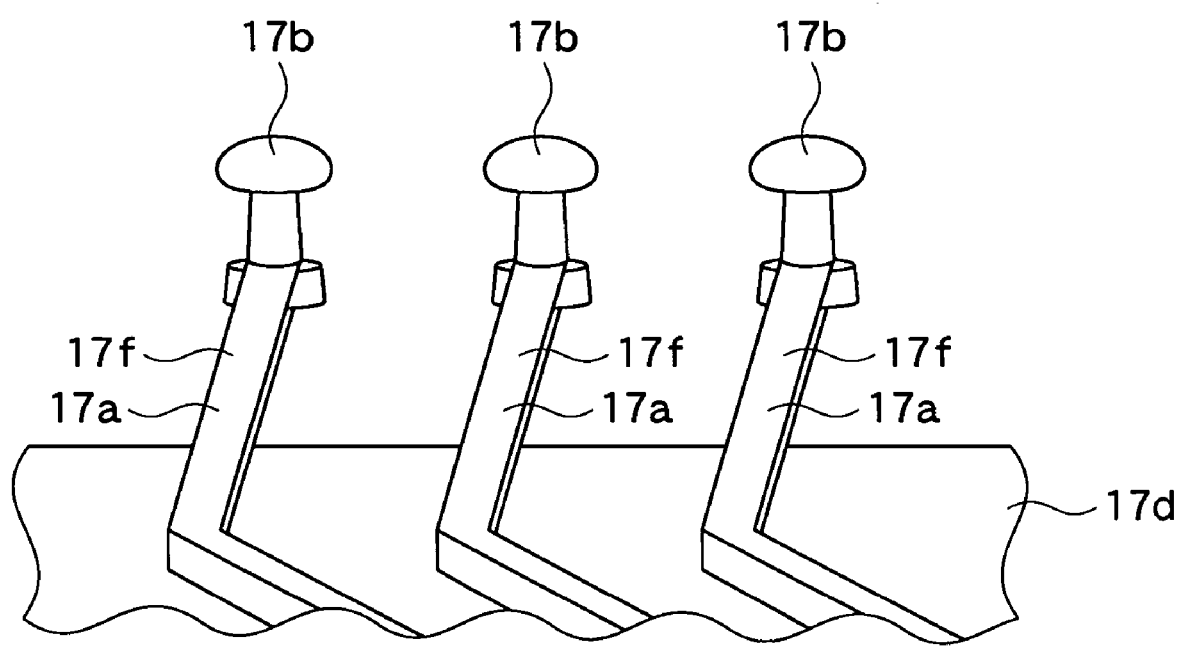
FIG. 6 is a view of a structural example of a conductive projection formed at a front end of the cantilever of the first embodiment.
Figure 7:
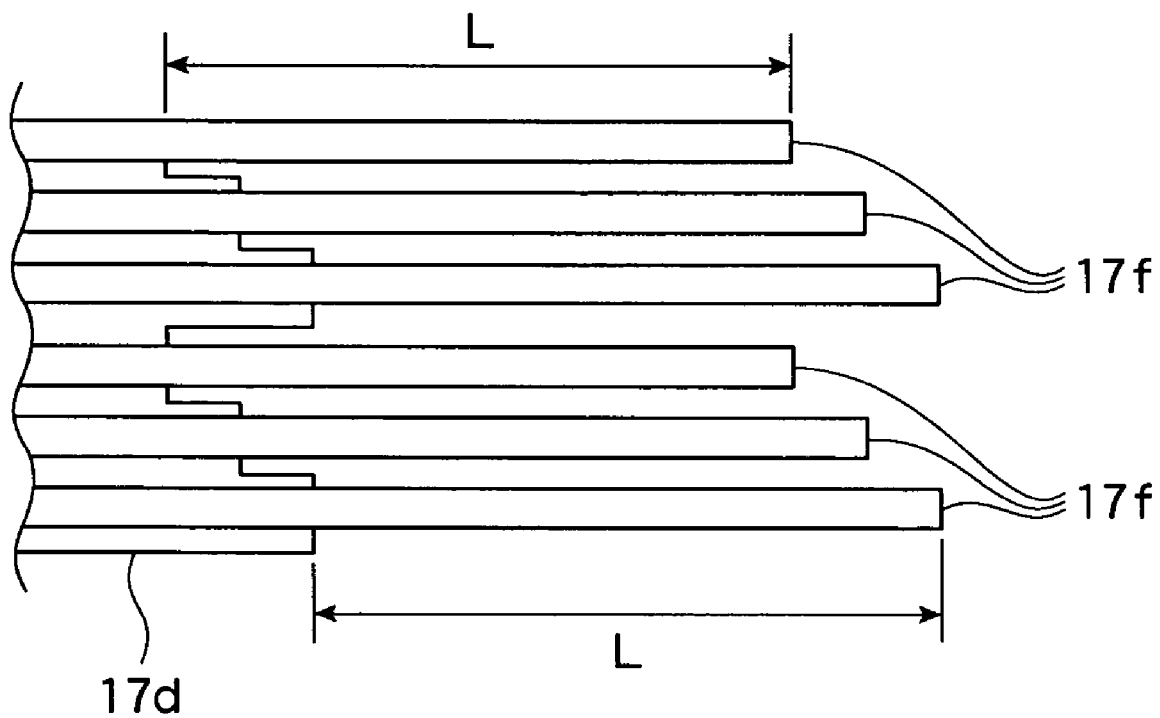
FIG. 7 is a plan view of one of the variations of the cantilever of the first embodiment.

FIG. 6 shows one structural example of the conductive projection 17b provided in the vicinity of the front end portion of the first arm portion 17f of the cantilever 17a. The conductive projection 17b is formed to have a mushroom shape having a semi sphere shape at its upper surface contact portion.

According to this shape, even when LSI terminal 12a is pushed onto the contact portion and the first arm portion 17b is displaced, a good contact condition can be attained because the contact is made along the hemisphere surface. Other variations for the conductive projection 17b can also be adopted. For example, the conductive projection 17b is made into a cylindrical shape with a plain square or with a hole at its top surface. Other variations such as square pole or pentagonal pole can also be adopted for the conductive projection 17b. In this case, a corner portion of the front edge of these poles can be sharply contacted to the terminal. Furthermore, a metal post by plating, a metal bump or a projection made by ultra fine particle jet printing method can also be used as the conductive projection 17b, being able to reduce the contact resistance.

When the cantilever 17a is made of high-resistance silicon, a leak current and crosstalk between each cantilever can be surely prevented.

A plurality of the first arm portions 17f of the cantilever 17a should be arranged in a narrower pitch so as to correspond to the arrangement of the terminals of the LSI 12 to be tested. One way to solve this problem is to arrange the first arm portions 17f in a manner that a group of three adjacent arm portions each of which has a different length to be arranged in a zigzag manner one after another. However if the length of the first arm portions 17f are made different, a force to deform the arm portion becomes different for each arm portion and a contact force when contacting with the terminal 12a will vary, being undesirable. In order to eliminate these undesirable problems, the shape of a portion of the pedestal 17d from which each first arm portion 17f is extended is projected and the amount of protrusion is made different for each first arm so as to arrange the position of the contact portion of each first arm portion 17b (conductive projection 17b) in a zigzag manner, without changing the length of the first arm portion.

Next, formation of a spring portion of the first and second arm portions 17f, 17g and formation of the conductive projection 17b will be explained below.

Figure 8:
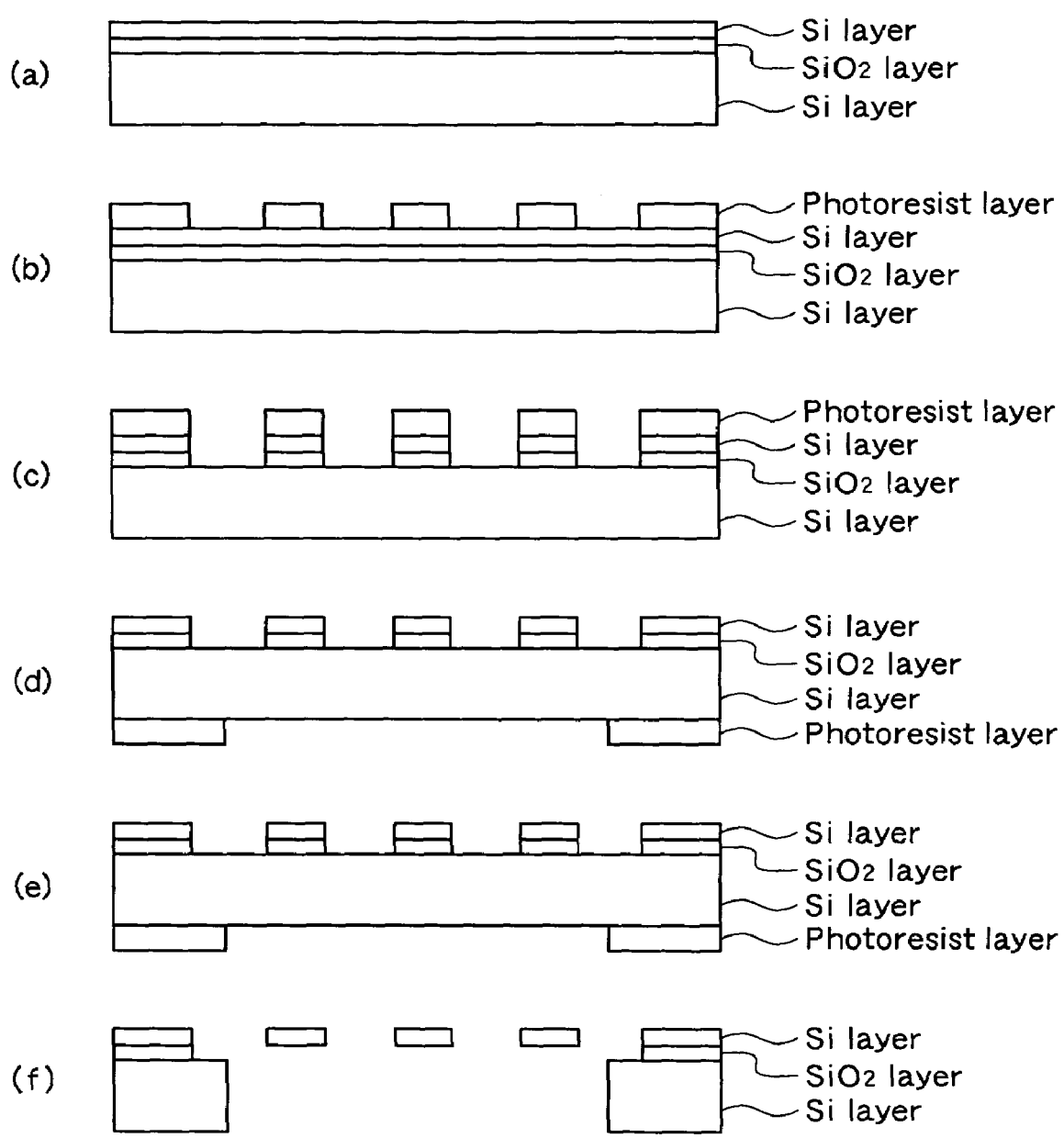
FIG. 8 is an explanatory diagram showing a manufacturing process of a spring of the first embodiment.

(1) Formation procedure of the spring portions of the first and second arm portions 17f, 17g (see FIG. 8)

First in process (a) of FIG. 8, three layers—Si layer, SiO$_2$ layer, Si layer—are laminated. Then, in the process (b) in FIG. 8, on the uppermost Si layer, a photoresist layer the configuration of which corresponds to the shape of the spring is formed by photolithography. Then in process (c) of FIG. 8, the uppermost Si layer is dry-etched such that a portion (a surface portion which is covered by the photoresist layer) which corresponds to the shape of the spring is remained and other portion is removed.

In process (d) of FIG. 8, the photoresist layer on the surface is removed and another photoresist layer is formed on the rear surface by photolithography. Thereafter in process (e) of FIG. 8, a portion of the undermost Si layer which corresponds to the spring portion (rear surface portion covered by the photoresist layer) is removed. And then in process (f) of FIG. 8, SiO$_2$ layer which corresponds to the spring portion is removed, and also the photoresist layer on the rear surface is removed. Thus the formation processes of the three spring portions made of Si layer is completed.

After these processes, on the spring portion made of Si, SiO$_2$ layer (an insulating layer) and Ni layer is laminated, and then gold-cobalt plating layer is plated to complete the formation of the first and second arm portions 17f, 17g (this process is not shown in FIG. 8).

Figure 9:
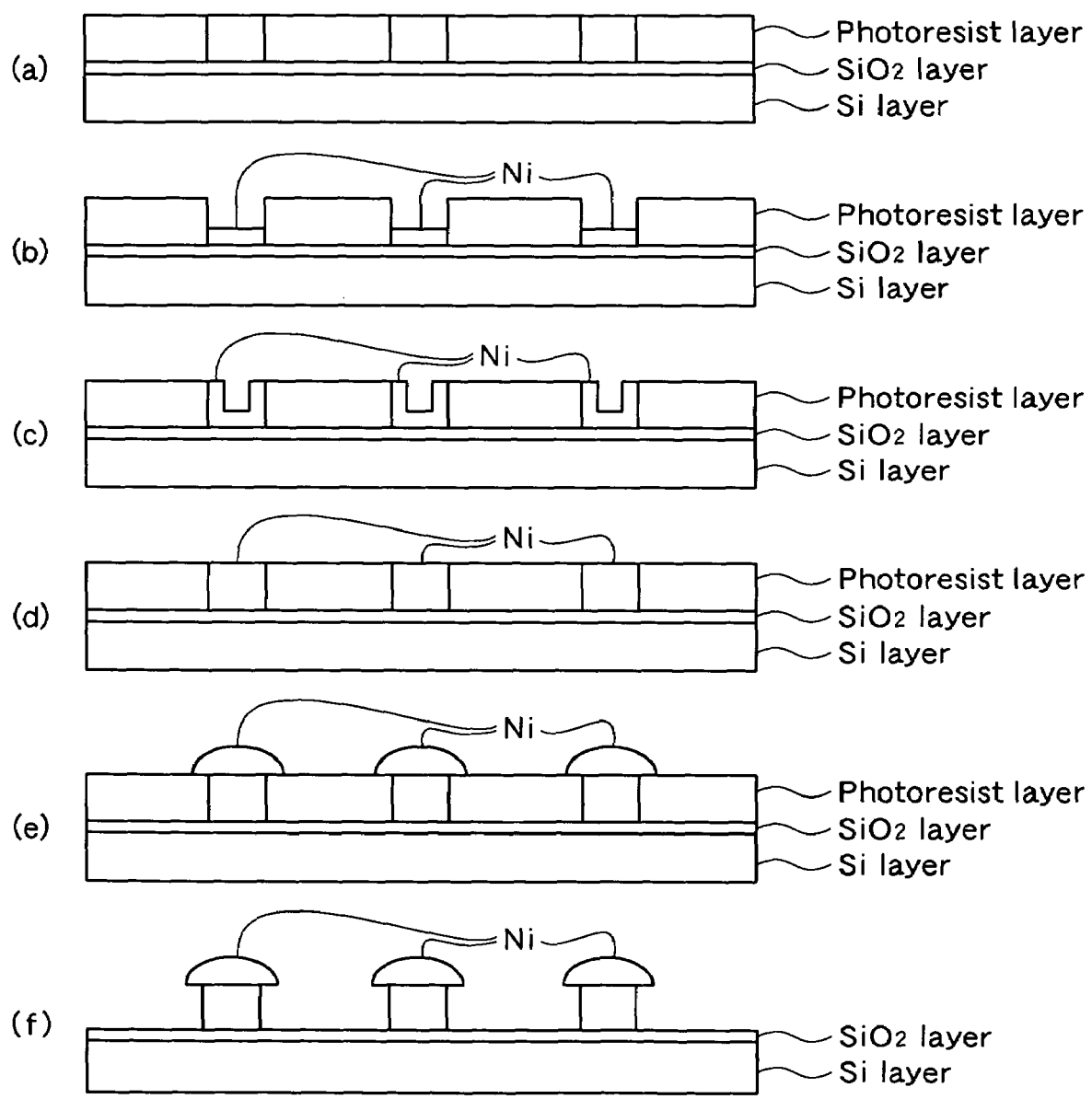
FIG. 9 is an explanatory diagram of a manufacturing process of a conductive projection of the first embodiment.

(2) Formation procedure of the conductive projection 17b (see FIG. 9)

First in process (a) of FIG. 9, SiO$_2$ layer is laminated on the Si layer. On the SiO$_2$ layer, resist layer is applied. A hole is made at a prescribed position in this resist layer by photolithography. Then in process (b) of FIG. 9, plate-like Ni layer is formed in the hole by electroforming. Further, when electroforming is continued, Ni is formed to be a concave shape as is seen in process (c) of FIG. 9. In process (d) of FIG. 9, the concave portion of the concave shape made of Ni is filled such that the upper surface thereof becomes flat. When the electroforming is further continued, the upper surface thereof is built up to project upward. Then in a process (e) of FIG. 9, the resist layer is removed, forming a plurality of the conductive projections 17b having a mushroom shape.

In such a structure in which such a probe chip 17 mentioned above is used, contact function of the probe pin to the DUT (in the probe chip 17 of the present invention, this function is realized by the cantilever 17a made of silicon) can be realized, and a connecting function to a PCB can be separated from the contact function. Accordingly, in case where the probe pin (cantilever 17a) is broken or stained, the probe chip 17 can be replaced with another one by only removing the probe chip 17 from the probe card 11.

In the present invention, the probe chip 17 can be detachably attached to the guide frame 13 using the fixing jig 15 and the fixing jig 15 having a conductive path 15b for electrically connecting the second arm portion 17g of the cantilever 17a of the probe chip 17 to the wiring board 18 can also be detachably attached to the guide frame 13, and the second arm portion 17g of the cantilever 17a of the probe chip 17 is elastically bent toward the guide frame 13 using the fixing jig 15 such that the second arm portion 17g of the cantilever 17a is electrically connected to an end portion of the conductive path 15b of the fixing jig 15 using the repulsive force of the cantilever 17a. Accordingly, in case where breakage or stain occurs in the probe pin (cantilever 17a), the probe pin (cantilever 17a) can be replaced with another one by only replacing the probe chip 17, being able to improve efficiency of the LSI testing.

Further, the cantilever 17a is made of silicon that has excellent mechanical properties and can be processed with precision by using semiconductor fine-processing technology. Accordingly, small-sized probe pins (cantilevers 17a) which have not been realized so far can be realized, and even probe chips having narrow pitch can also be realized.

Further, because an insulating layer 17h is provided under the metal wiring layer 17k, electrical insulating property between each silicon cantilever 17a can be improved. And current leakage between each cantilever 17a and crosstalk of high frequency signals can be reduced.

Further because the conductive projection 17b is provided in the vicinity of the end portion of the second arm portion 17g of the cantilever 17a as shown by the two-dot chain line in FIG. 3, the probe chip 17 that enables reliable electrical contact with the fixing jig 15 can be realized.

Further, because the conductive projection 17b and the metal wiring layer 17k are covered by the plating layer 17n at the same time, mechanical strength of the conductive projection 17b can be improved.

Further, because the pedestal 17d of the probe chip 17 is made of silicon, it is possible to use the semiconductor fine-processing technology so that fitting structure which is, for example, used in detachably attaching the probe chip 17 to the guide frame 13 can be formed with high precision.

Further, because the conductive projection 17b is formed to have a mushroom shape at its head portion, a constant contact area can be secured at the time the conductive projection is made contacted with the terminal 12a of LSI 12, enabling to stabilize the contact resistance between them.

SECOND EMBODIMENT

FIGS. 10 to 13 represent a second embodiment of the present invention.

Figure 10:
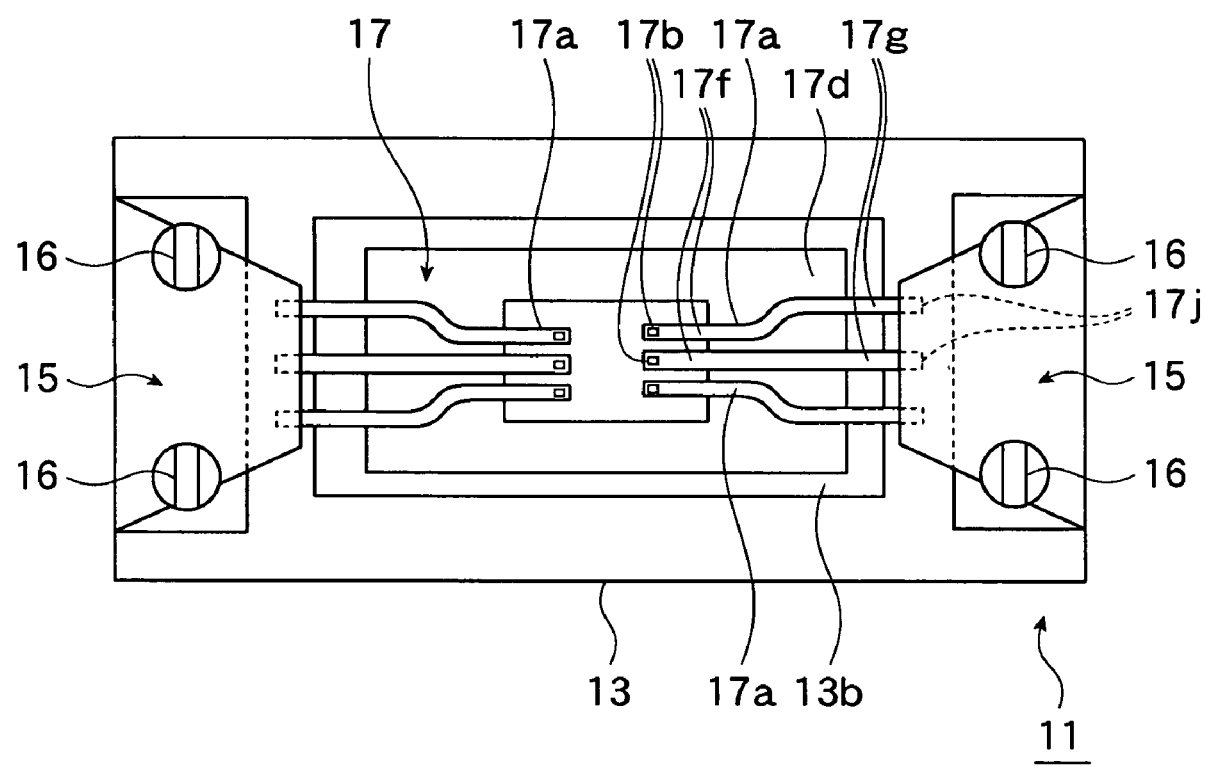
FIG. 10 is a plan view of a probe card of a second embodiment.

In the second embodiment, as shown in FIG. 10 which is a plan view, at a central portion of the guide frame 13, a rectangle-like platform 13b is formed. On the platform 13b, the pedestal 17d of the probe chip 17 is positioned. The pedestal 17d is a square-like frame having an opening in the central portion thereof. On upper surfaces, which are opposed to each other, of the pedestal 17d, cantilevers 17 are provided. The first arm portion 17f, which is designed to contact with the terminal 12a of LSI 12, has a front edge portion faced to the opening of the pedestal 17d and is designed to be elastically deformable. The second arm portion 17g positioned on the other side of the cantilever 17 is extended toward the outside of the pedestal 17. The second arm portion 17g is designed to be elastically deformable as in a case of the first arm portion 17b. On the outer side of the second arm portion 17g, a pair of fixing jigs 15 are provided to be attached to the guide frame 13 at the right and left side thereof. At this time, the conductive path 15b of the fixing jig 15 abuts on the conductive cantilever 17a so as to ensure electrical continuity.

Figure 11:
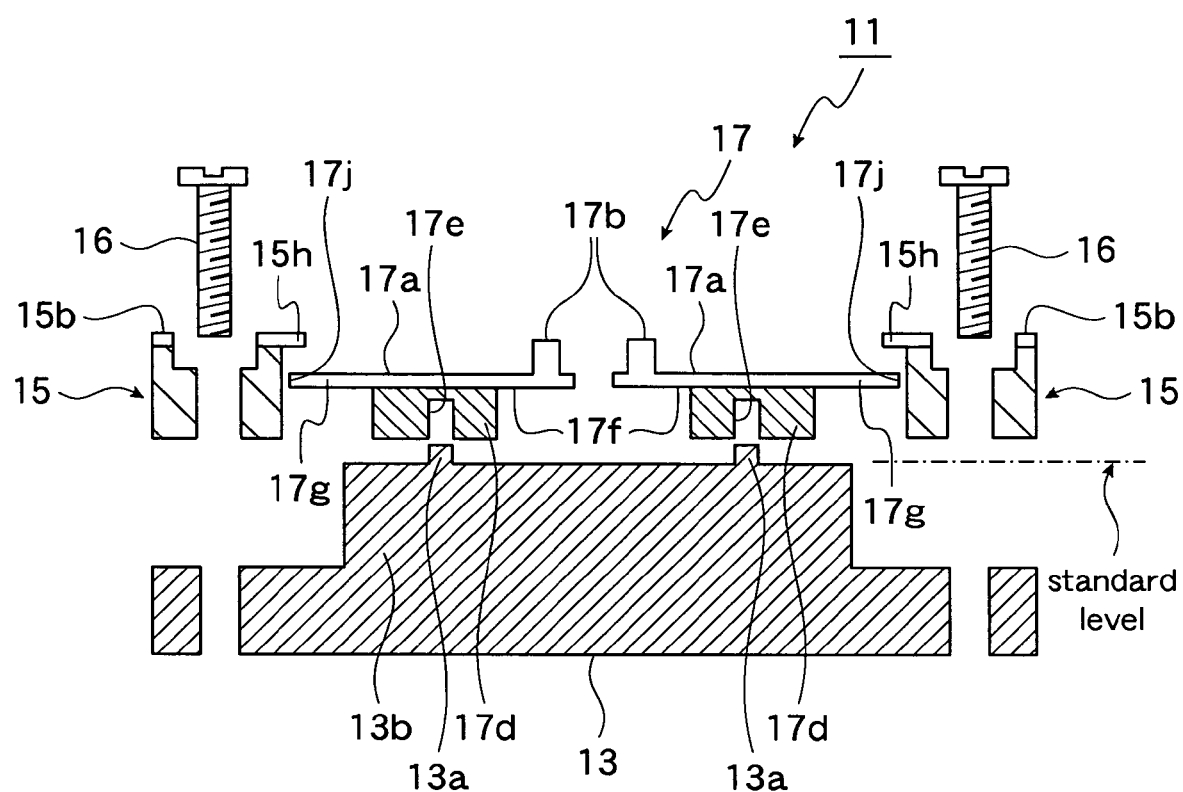
FIG. 11 is a sectional view showing fixing principle of the probe chip in the probe card of the second embodiment.

Fixing principle for fixing the probe chip 17 to the guide frame 13 is shown in FIG. 11. A standard projection 13a provided on an upper surface of the guide frame 13 is inserted into an alignment hole 17e provided on the pedestal 17d of the probe chip 17 and then fixed.

Thus the positioning of the guide frame 13 in X and Y direction in the plan view of FIG. 10 with respect to the probe chip 17 can be achieved. As shown in FIG. 11, the under surface of the pedestal 17d of the probe chip 17 abuts on a standard surface of a platform 13b of the guide frame 13. Thus positioning of the probe chip 17 in Z direction with respect to the guide frame 13 can be achieved and the probe chip 17 can be exactly attached to the guide frame 13.

Figure 12:
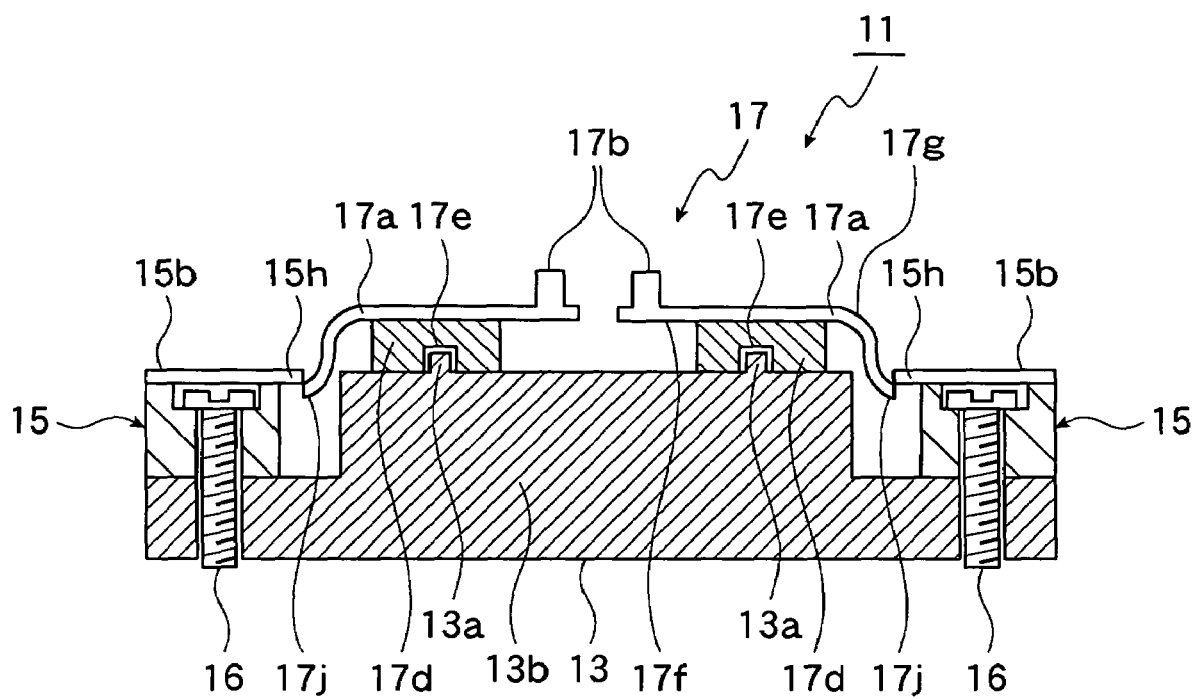
FIG. 12 is a sectional view showing the fixing principle of the probe chip in the probe card of the second embodiment.
Figure 13:
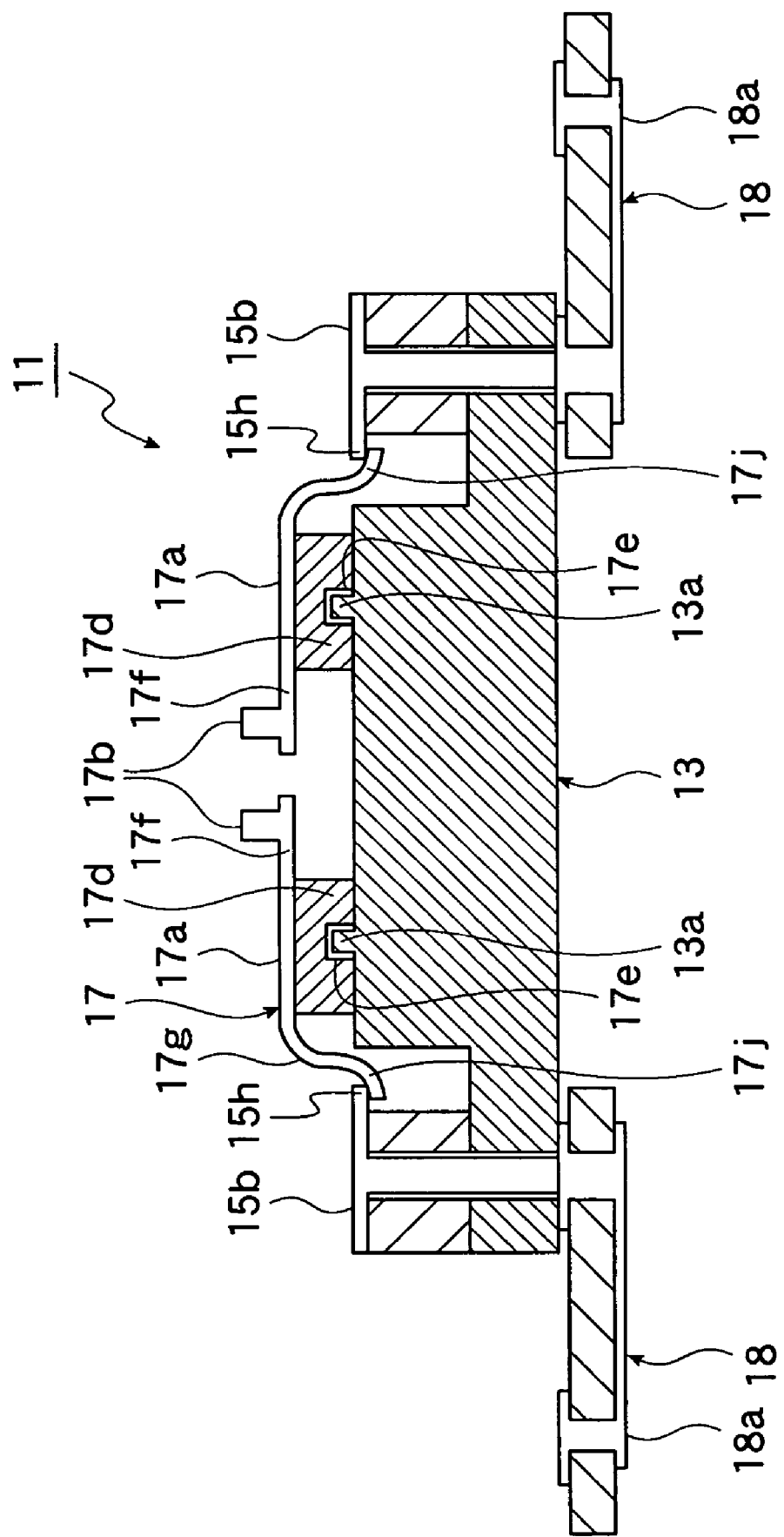
FIG. 13 is a sectional view showing the fixing principle of the probe chip in the probe card of the second embodiment.

FIGS. 12 and 13 show a state of the probe chip 17 which is fixed to the guide frame 13 with the fixing jig 15 and a bolt 16. At this point of time, a contact portion 17j of the second arm portion 17g of the cantilever 17a of the probe chip 17 is abutted on an edge portion 15h of the conductive path 15b of the fixing jig 15 and fixed, with the second arm portion 17g being bent. The second arm portion 17g and the conductive path 15b are fixed to each other only by abutting onto each other without using other connecting means such as soldering etc.

Accordingly, in case where a portion of the cantilever 17a of the probe chip 17 is broken during LSI testing or where inspection accuracy becomes low due to overall contamination occurred at the contact portion of the cantilever 17a, the probe chip 17 can be taken out from the guide frame 13 by only unloosening the bolt 16 and removing the fixing jig 15. Thus, the old probe chip 17 can be replaced with a new one and is fixed to the guide frame 13 by holding it down with the fixing jig 15. Thus, the probe card 11 can be easily recovered by replacing the probe chip 17 in a short time.

The other structures and functions of this second embodiment are substantially similar to those of the first embodiment, so that the details thereof are omitted herein.

THIRD EMBODIMENT

Figure 14:
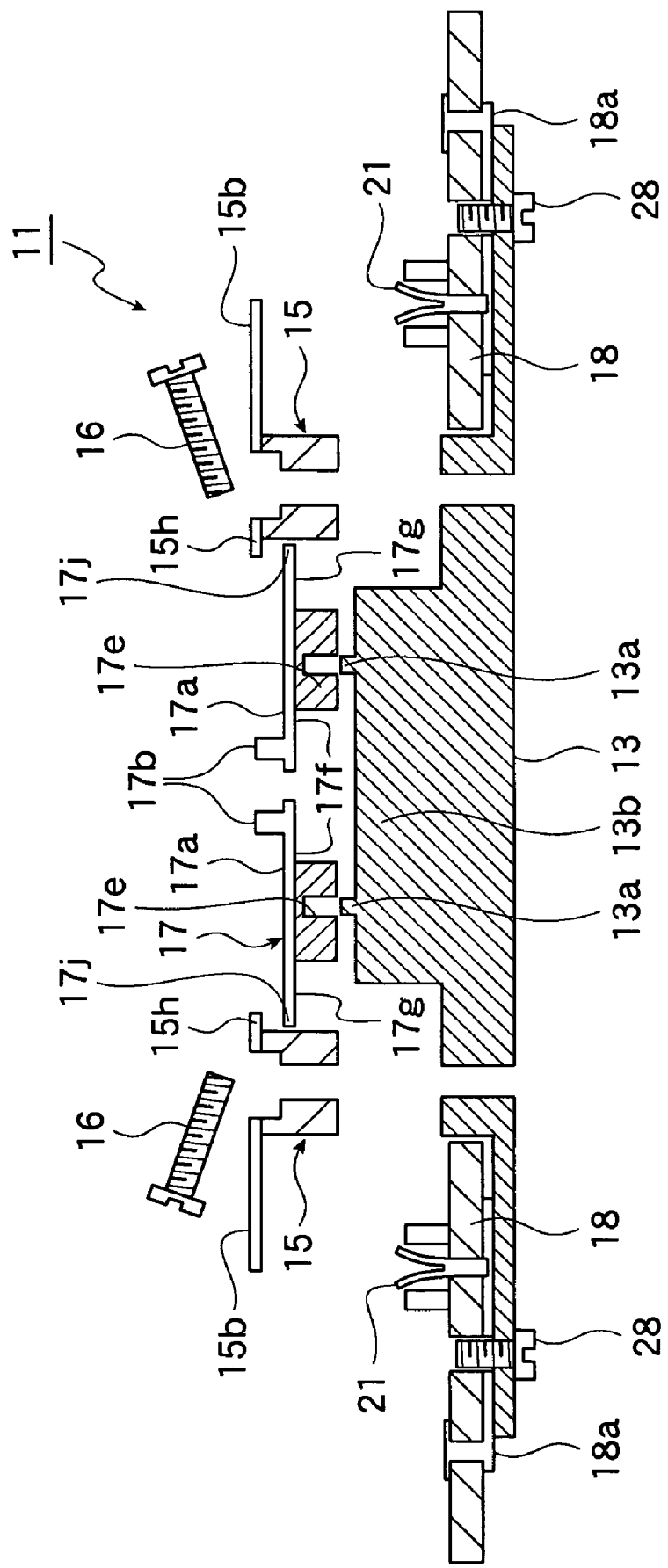
FIG. 14 is a sectional view of a probe card of a third embodiment.
Figure 15:
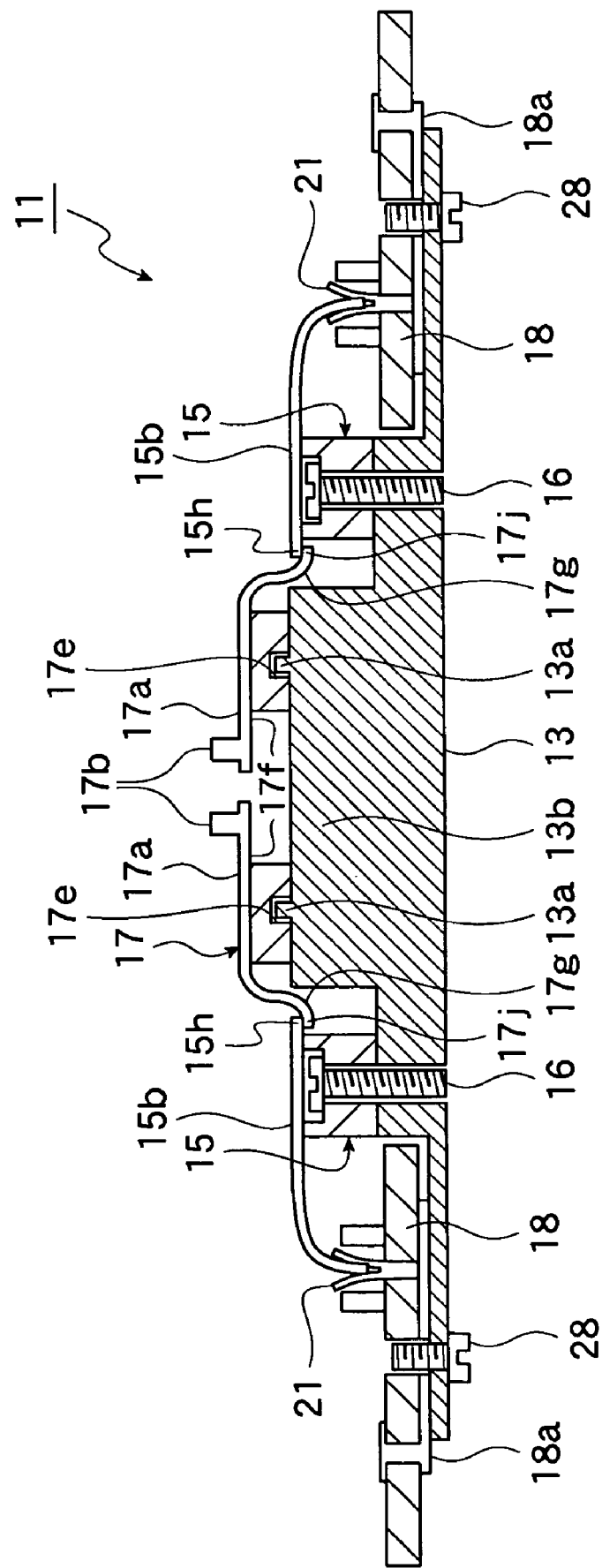
FIG. 15 is a sectional view of the probe card of the third embodiment.

FIGS. 14 and 15 represent a third embodiment of the present invention.

In the third embodiment, a connecting side of the conductive path 15b provided on the fixing jig 15, which is connected to the circuit board 18, is formed with a flexible board and a connecting pin 21 into which the flexible board is elastically deformed and inserted, is provided on the side of the circuit board 18. To the circuit board 18, the guide frame 13 is attached with a fixing screw 28.

According to this embodiment, there is no need to provide the conductive path 15b within the fixing jig 15, making the structure of the probe card much simple.

The other structures and functions of this third embodiment are substantially similar to those of the first embodiment, so that the details thereof are omitted herein.

FOURTH EMBODIMENT

Figure 16:
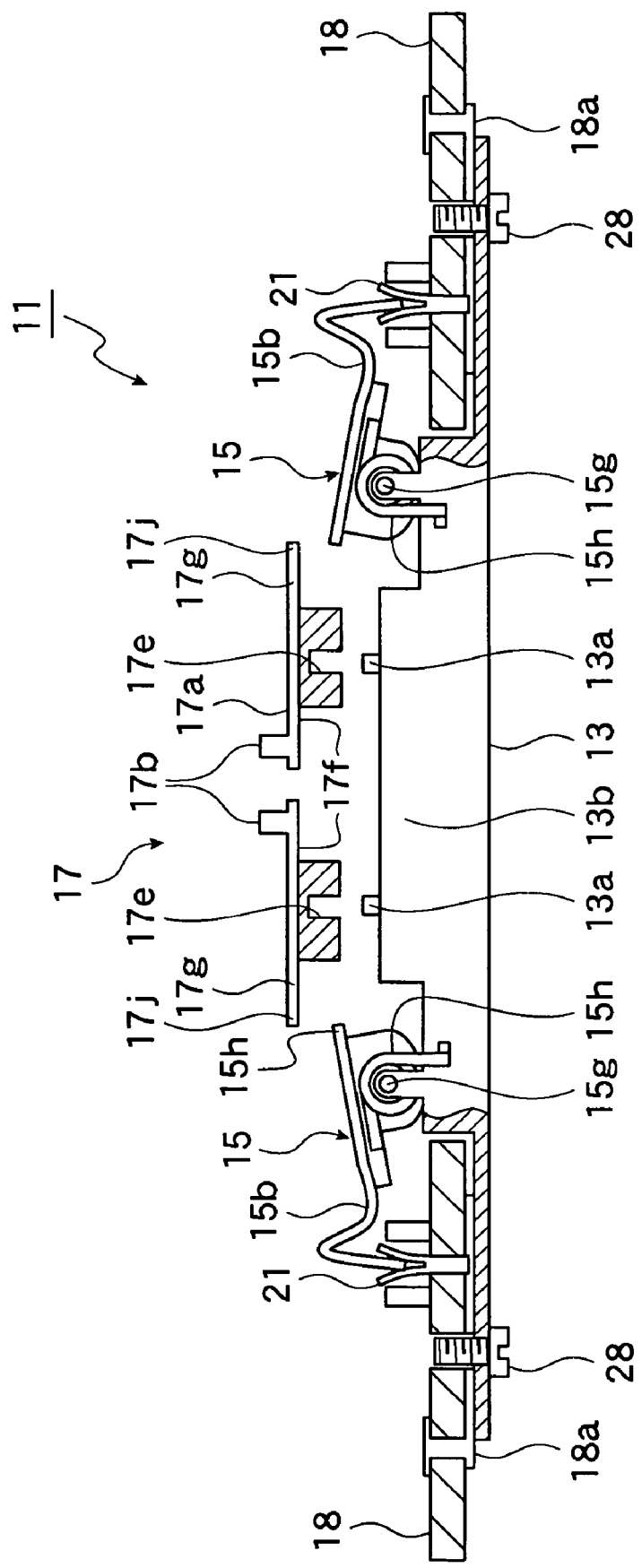
FIG. 16 is a sectional view of a probe card of a fourth embodiment of the present invention.
Figure 17:
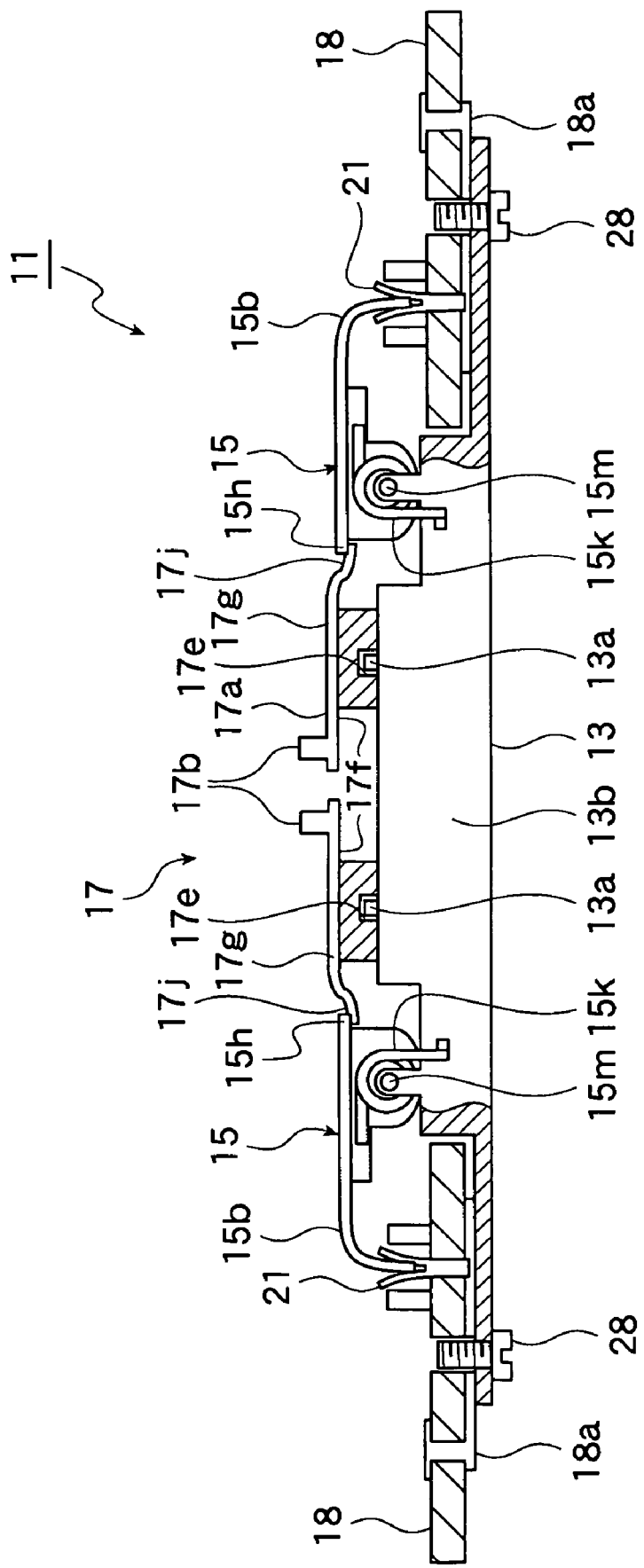
FIG. 17 is a sectional view of the probe card of the fourth embodiment.

FIGS. 16 and 17 represent a fourth embodiment of the present invention.

In the fourth embodiment, a connecting side of the conductive path 15b provided on the fixing jig 15, which is connected to the circuit board 18, is formed with a flexible board and a connecting pin 21 into which the flexible board is inserted, is provided on the side of the circuit board 18. Further, the fixing jig 15 is structured to be rotatably attached to the guide frame 13 through a shaft 15m and urged toward a closing direction by a spring 15k attached to the shaft 15m.

According to this embodiment, the probe chip 17 is mounted on the guide frame 13 in a state where the fixing jig 15 is opened toward outside as shown in FIG. 16. And probe chip 17 can be fixed to the guide frame 13 by getting the fixing jig 15 back to its former state to be closed as shown in FIG. 17.

Therefore, there is no need to dismount the fixing jig 15 when replacing the probe chip 17 with another one, being able to make replacement workability much improved.

Other structures and functions of this fourth embodiment are substantially similar to those of the first embodiment, so that the details thereof are omitted herein.

FIFTH EMBODIMENT

Figure 18:
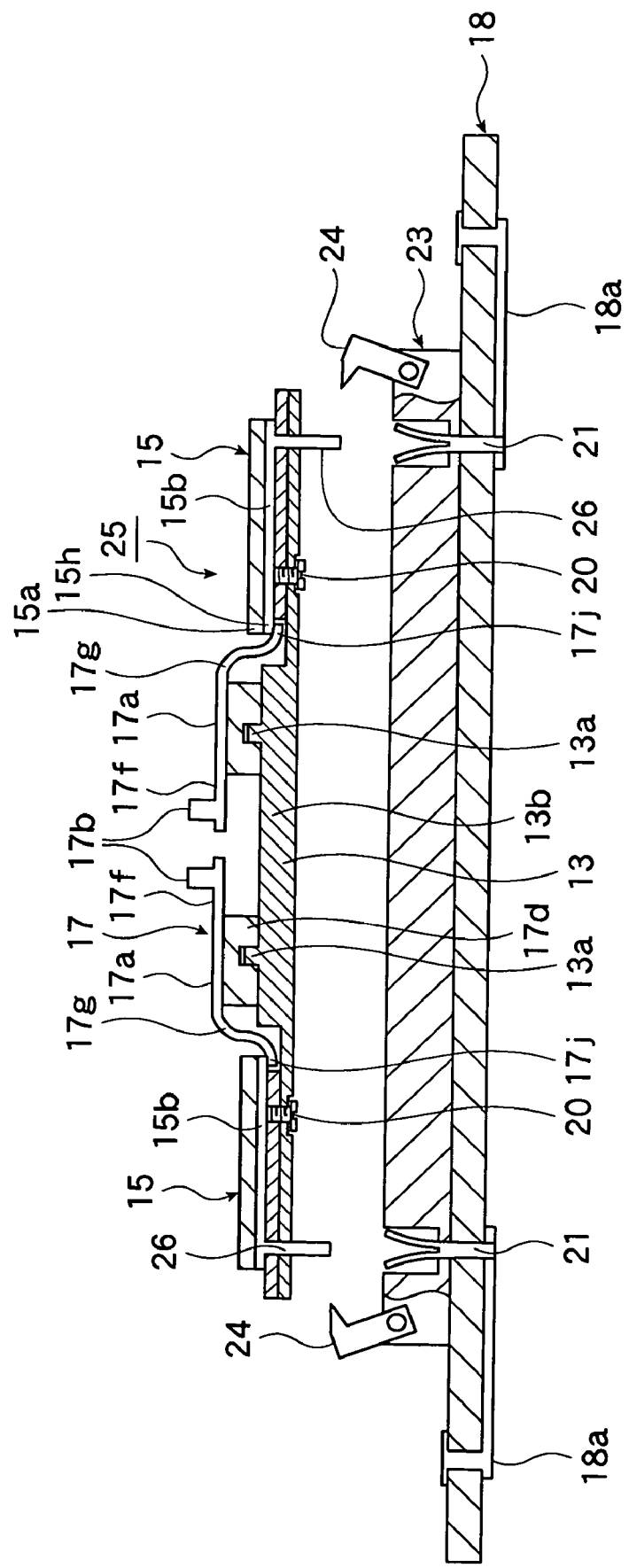
FIG. 18 is a sectional view of a probe card of a fifth embodiment of the present invention.
Figure 19:
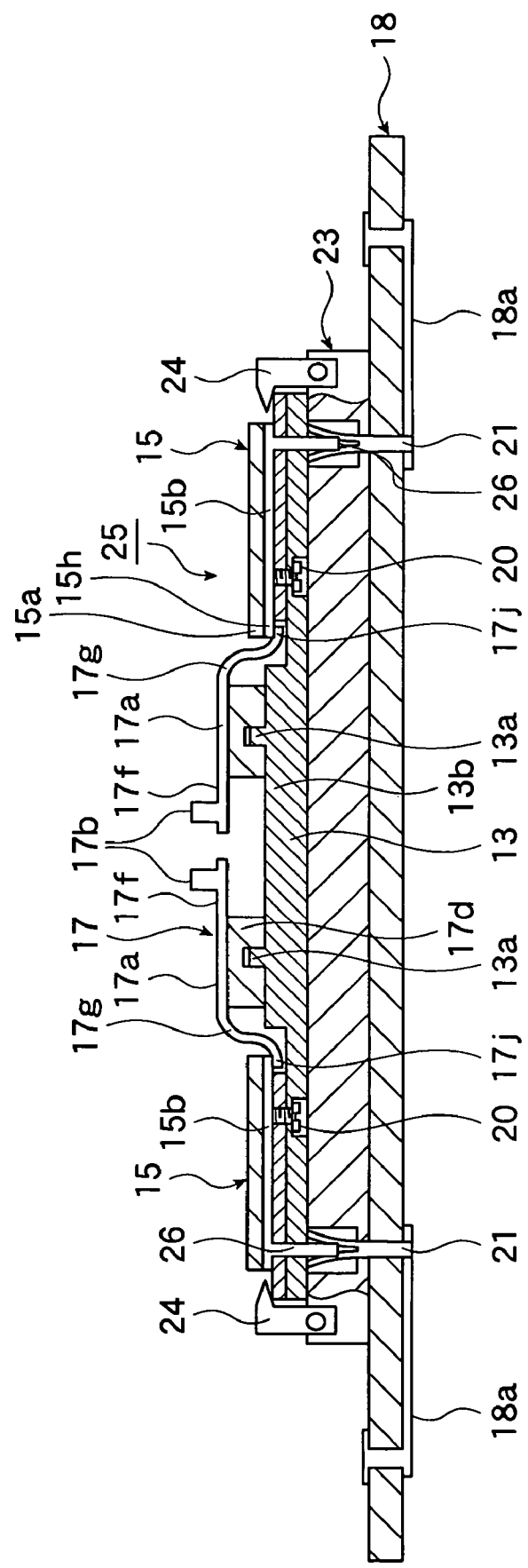
FIG. 19 is a sectional view of the probe card of the fifth embodiment.

FIGS. 18 and 19 represent a fifth embodiment of the present invention.

In the fifth embodiment, the probe chip 17 is attached to the guide frame 13 and then held down to be fixed by the fixing jig 15 so as to be a portable contact module 25. To the conductive path 15*b* of the fixing jig 15, a conductive pin 26, which is connected to the circuit board 18, is provided so as to project downward, and on the side of the circuit board 18, a socket 23, on which the contact module 25 can be mounted, is mounted.

The fixing jig 15 is detachably attached by a screw 20 to be inserted from under the guide frame 13. The socket 23 is provided with a connecting pin 21 projected from the side of the circuit board 18 and a conductive pin 26 is structured to be inserted into the connecting pin 21. Further, the socket 23 is rotatably provided with a latch 24, and the fixing jig 15 is held and fixed by the latch 24.

According to this embodiment, the fine probe chip 17 can be handled easily. And the contact module 25 is mounted on and fixed to the socket 23 by connecting the conductive pin 26 and the connecting pin 21 and by closing the latch 24. In case where there occurs a poor contacting etc. at the time of inspection of LSIs, the probe chip 17 on the circuit board 18 can be easily replaced with another one by replacing the whole contact module 25.

Moreover, the fixing jig 15 can also be removed and the probe chip 17 can be replaced with another one by removing the screw 20.

The other structures and functions of this fifth embodiment are substantially similar to those of the first embodiment, so that the details thereof are omitted herein.

SIXTH EMBODIMENT

Figure 20:
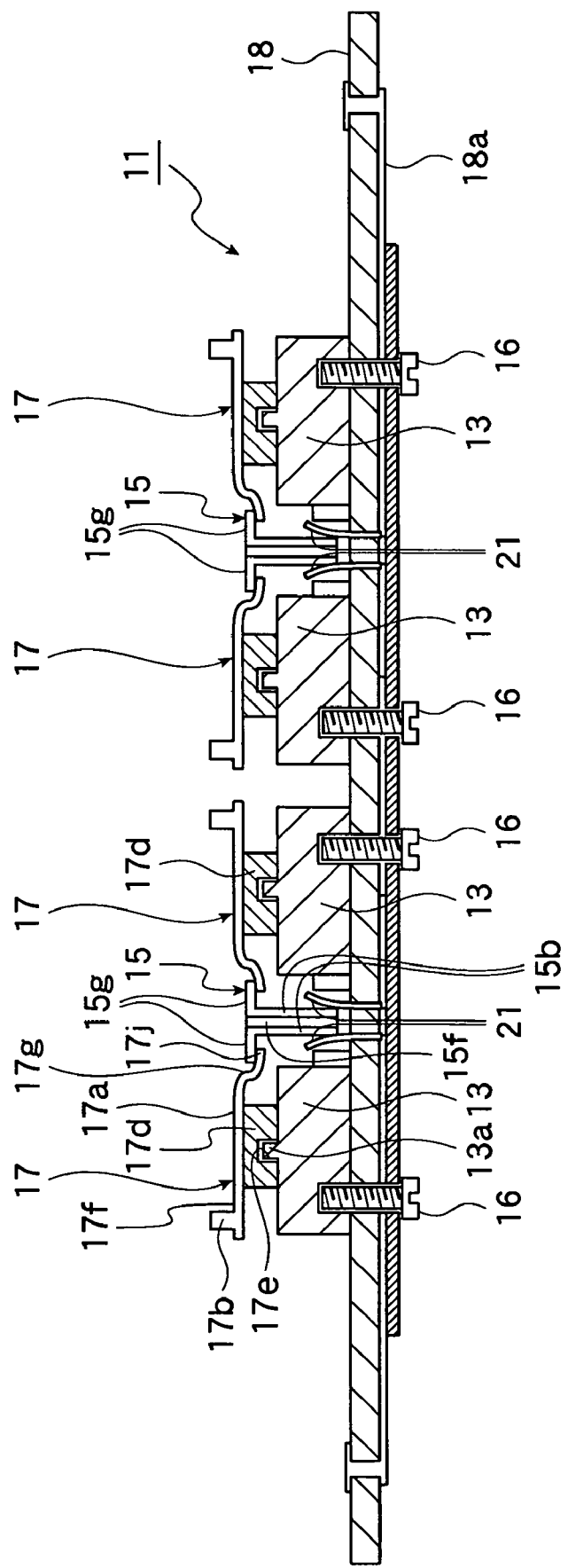
FIG. 20 is a sectional view of a probe card of a sixth embodiment of the present invention.
Figure 21:
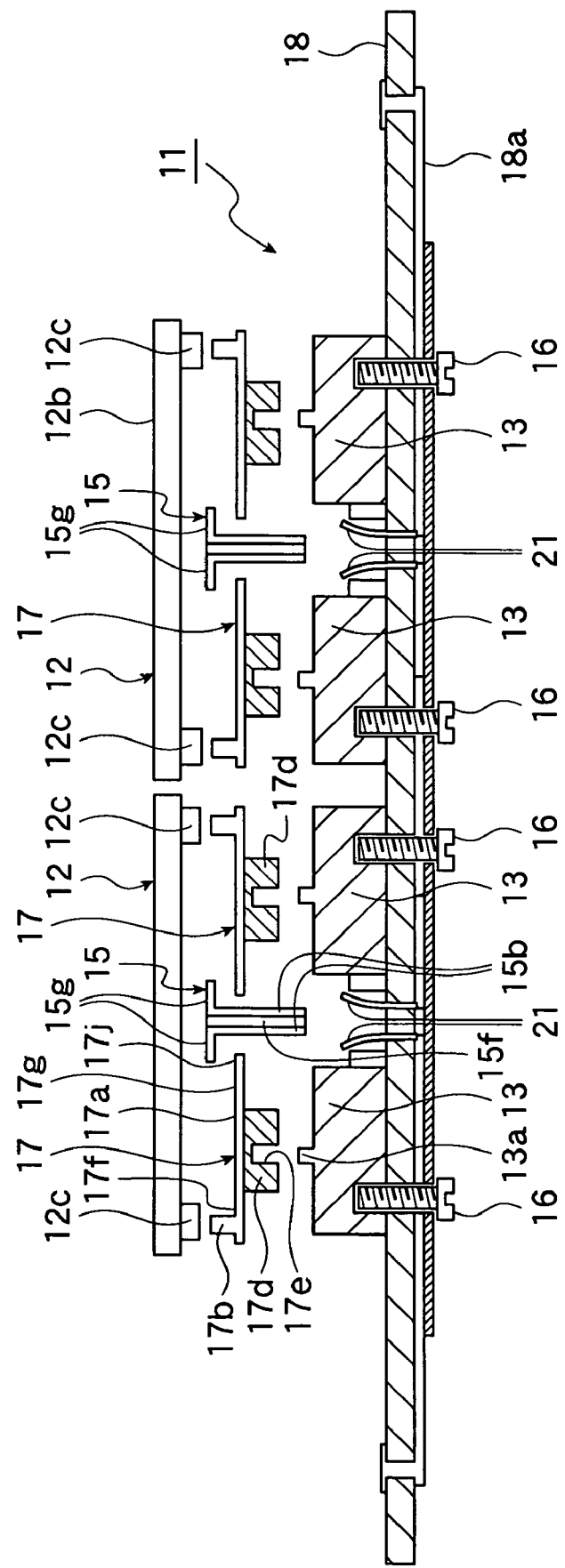
FIG. 21 is an exploded sectional view of a probe chip etc. of the probe card of the sixth embodiment.
Figure 22:
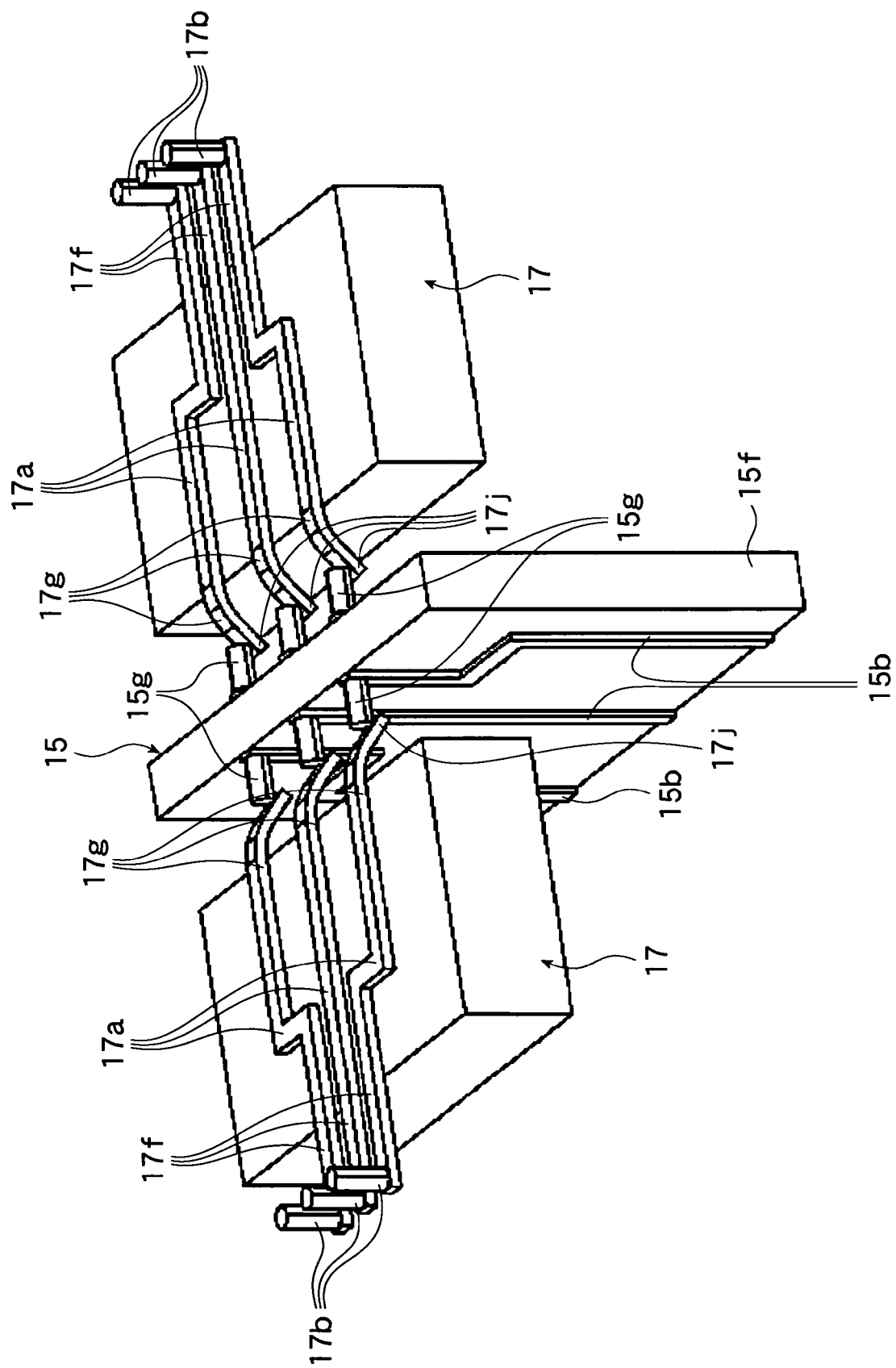
FIG. 22 is an exploded perspective view of a portion of the probe card of the sixth embodiment.

FIGS. 20 to 22 represent a sixth embodiment of the present invention.

The sixth embodiment corresponds to the inspection for a plurality of LSI 12 at the same time. As shown in these Figs., two sets of guide frames 13 are provided on the circuit board 18 as each set constitutes a pair of guide frames. Between these guide frames 13, a pair of connecting pins 21 on the circuit board 18 passes through vertically and is provided to project upward. Upper portions of the pair of connecting pins 21, which project higher than the circuit board 18, are slightly bent so as to widen the distance therebetween and are elastically deformable.

In addition, under the lower side of the circuit board 18, a mounting plate 30 is provided. The mounting plate 30 and the circuit board 18 are attached to the guide frame 13 by a screw 16 which passes through them from the underside. And the guide frame 13 is provided on the circuit board 18.

Further, on each guide frame 13, the probe chip 17 is provided. The probe chip 17, as shown in FIG. 22, has a plurality of cantilevers 17*a* provided on a frame-like pedestal 17*d*.

Of these cantilevers 17*a*, an opposing pair of cantilevers 17*a* has a conductive projection 17*b* on the outside portion and the conductive portion 17*b* of the cantilever 17*a* and, a contact portion 17*j* on the edge side opposite to the conductive projection 17*b* are formed opposite to each other at predetermined distance. Between the pair of contact portions 17*j*, the fixing jig 15 is inserted to establish an electrical connection between the cantilever 17*a* and the connecting pin 21.

These fixing jig 15 has a plate member 15*f*. On both surfaces, the conductive path 15*b* is formed and at an upper end portion of the conductive path 15*b*, pressing projection 15*g* is projectedly formed.

In addition, as shown in FIGS. 20 and 22, when the fixing jig 15 is inserted between the pair of connecting pins 21 and also between contact portions 17*j* of the pair of cantilevers 17*a*, the connecting pin 21 contacts with the lower portion of the conductive path 15*b* of the fixing jig 15, establishing an electrical connection. And the pressing projection 15*g* contacts an upper surface of the cantilever contact portion 17*j* so as to press the upper surface downward, making the cantilever 17 elastically deformed, and establishing an electrical connection with a determined contact pressure to prevent disengagement of the probe chip 17.

According to the structure mentioned above, the probe chip 17 can be easily arranged under a state that the probe chip 17 is held or pressed down by only inserting the fixing jig 15. A plurality of LSIs 12 are arranged closely to each other as shown in FIG. 21 and can be used for inspection of a large number of LSIs.

The fixing jig 15 has a flat like plate member 15*f*. On both surfaces, the conductive path 15*b* is formed and the fixing jig 15 is only inserted in the vertical direction. Thus, the space in width direction occupied by the fixing jig 15 can be made smaller and downsizing of the apparatus as a whole can be realized.

The other structures and functions of this sixth embodiment are substantially similar to those of the first embodiment, so that the details thereof are omitted herein.

In the above mentioned embodiment, the test object to be inspected is referred to LSI 12 but the present invention is not limited to such test object. Inspection can be carried out smoothly even when, for example, wafer elements such as elements that silicon chip is not yet cut off from wafer silicon, is used as a test object Furthermore, when the pedestal is made of an insulating material, the insulating layer on the upper surface thereof can be omitted so that the cantilever can be formed directly on the pedestal.

The invention claimed is:

1. A probe chip comprising:
   a pedestal;
   an insulating layer on the pedestal; and
   a plurality of cantilevers made of silicon,
   wherein the cantilevers are disposed on the insulting layer and have first and second arm portions extending substantially horizontally from the pedestal in opposite directions to each other,
   wherein a metal wiring layer which extends from the first to the second arm portions is formed on each surface of the cantilevers, and a conductive projection is electrically connected to the metal wiring layer in the vicinity of an end portion of the first arm portion, and
   wherein the cantilevers made of silicon on the insulating layer which is formed on the pedestal are made of a high-resistance silicon.

2. The probe chip according to claim 1 wherein
   another insulating layer is formed on the surface of the cantilever, and the metal wiring layer extending from the first to the second arm portion is formed on the insulating layer of each cantilever.

3. The probe chip according to claim 1 wherein another conductive projection is provided to be electrically connected to the metal wiring layer of the second arm portion.

4. The probe chip according to claim 1 wherein the conductive projection is a metal post formed by plating, a metal bump or a projection formed by ultra-fine particle jet printing.

5. The probe chip according to claim 1 wherein the metal wiring layer on the cantilevers made of silicon and the conductive projection are covered by a plating layer.

6. The probe chip according to claim 1 wherein the conductive projection is formed to have a mushroom shape.

7. A probe chip comprising:
a pedestal;
an insulating layer on the pedestal; and
a plurality of cantilevers made of silicon,
wherein the cantilevers are disposed on the insulating layer and have first and second arm portions extending substantially horizontally from the pedestal in opposite directions to each other,
wherein a metal wiring layer which extends from the first to the second arm portions is formed on each surface of the cantilevers, and a conductive projection is electrically connected to the metal wiring layer in the vicinity of an end portion of the first arm portion, and,
wherein the pedestal is made of silicon.

8. The probe chip according to claim 7 wherein another insulating layer is formed on the surface of the cantilevers, and the metal wiring layer extending from the first to the second arm portions is formed on the insulating layer of each cantilever.

9. The probe chip according to claim 7 wherein another conductive projection is provided to be electrically connected to the metal wiring layer of the second arm portion.

10. The probe chip according to claim 7 wherein the conductive projection is a metal post formed by plating, a metal bump or a projection formed by ultra-fine particle jet printing.

11. The probe chip according to claim 7 wherein the metal wiring layer on the cantilevers made of silicon and the conductive projection are covered by a plating layer.

12. The probe chip according to claim 7 wherein the conductive projection is formed to have a mushroom shape.

13. A probe chip comprising:
a pedestal;
an insulating layer on the pedestal; and
a plurality of cantilevers made of silicon,
wherein the cantilevers are disposed on the insulating layer and extend substantially horizontally from the pedestal in opposite directions to each other,
wherein a fitting hole being used for fitting of the pedestal is formed on the under-side of the pedestal, and
wherein the cantilevers have first and second arm portions extending from the pedestal in opposite directions to each other, a metal wiring layer extending from the first to the second arm portions, a conductive projection which is electrically connected to the metal wiring layer in the vicinity of an end portion of the first arm portion.

14. The probe chip according to claim 13 wherein another insulating layer is formed on the surface of the cantilevers, and the metal wiring layer extending from the first to the second arm portions is formed on the insulating layer of each cantilever.

15. The probe chip according to claim 13 wherein another conductive projection is provided to be electrically connected to the metal wiring layer of the second arm portion.

16. The probe chip according to claim 13 wherein the cantilevers made of silicon on the insulating layer which is formed on the pedestal are made of a high-resistance silicon.

17. The probe chip according to claim 13 wherein the conductive projection is a metal post formed by plating, a metal bump or a projection formed by ultra-fine particle jet printing.

18. The probe chip according to claim 13 wherein the metal wiring layer and the conductive projection on the cantilevers are covered by a plating layer.

19. The probe chip according to claim 13 wherein the pedestal is made of silicon.

20. The probe chip according to claim 13 wherein the conductive projection is formed to have a mushroom shape.

* * * * *